(12) United States Patent
Koo et al.

(10) Patent No.: US 11,658,147 B2
(45) Date of Patent: May 23, 2023

(54) SEMICONDUCTOR MANUFACTURING APPARATUS

(71) Applicant: SAMSUNG ELECTRONICS CO., LTD., Suwon-si (KR)

(72) Inventors: Ilhyoung Koo, Asan-si (KR); Youngshin Choi, Asan-si (KR); Changho Lee, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/489,310

(22) Filed: Sep. 29, 2021

(65) Prior Publication Data

US 2022/0310551 A1 Sep. 29, 2022

(30) Foreign Application Priority Data

Mar. 24, 2021 (KR) .......................... 10-2021-0038272

(51) Int. Cl.
*B23K 1/00* (2006.01)
*H01L 23/00* (2006.01)
(Continued)

(52) U.S. Cl.
CPC .............. *H01L 24/75* (2013.01); *B23K 1/018* (2013.01); *B23K 1/206* (2013.01); *H01L 24/799* (2013.01);
(Continued)

(58) Field of Classification Search
CPC ................... H01L 24/75; H01L 24/799; H01L 2224/7501; H01L 2224/75263;
(Continued)

(56) References Cited

U.S. PATENT DOCUMENTS 6,220,499 B1 *  4/2001  Brofman ........... H01L 21/67144
                                          257/E21.511
6,227,436 B1 *  5/2001  Nishikawa ........... B23K 1/0016
                                          228/205

(Continued)

FOREIGN PATENT DOCUMENTS

CN      1949469 A  *  4/2007  ............. H01L 24/75
CN    102861959 A  *  1/2013  ........... B23K 1/0016
(Continued)

*Primary Examiner* — Kiley S Stoner
(74) *Attorney, Agent, or Firm* — Volentine, Whitt & Francos, PLLC

(57) ABSTRACT

A semiconductor manufacturing apparatus includes; a component separating apparatus configured to separate a defective component from a substrate, a bump conditioning apparatus including an end mill cutter and receiving the substrate following separation of the defective component from the substrate, the bump conditioning apparatus being configured to cut a first connection bump using the end mill cutter to provide a conditioned first connection bump, and the first connection bump being exposed by separating the defective component from the substrate, and a component attaching apparatus configured to receive the substrate following provision of the conditioned first connection bump, and mount a new component including a second connection bump to the substrate by coupling the second connection bump and the conditioned first connection bump.

19 Claims, 20 Drawing Sheets

(51) Int. Cl.
*B23K 1/018* (2006.01)
*B23K 1/20* (2006.01)
*B23K 101/40* (2006.01)

(52) U.S. Cl.
CPC .. *B23K 2101/40* (2018.08); *H01L 2224/7501* (2013.01); *H01L 2224/7555* (2013.01); *H01L 2224/75263* (2013.01); *H01L 2224/75753* (2013.01)

(58) Field of Classification Search
CPC .. H01L 2224/7555; H01L 2224/75753; B23K 1/018; B23K 1/206; B23K 2101/40
USPC .................................. 228/119, 191, 264, 13
See application file for complete search history.

(56) References Cited

U.S. PATENT DOCUMENTS

| | | | | |
|---|---|---|---|---|
| 6,471,115 B1 * | 10/2002 | Ijuin | ..................... | H01L 21/563 228/205 |
| 9,916,989 B2 | 3/2018 | Yoon et al. | | |
| 2011/0168761 A1 | 7/2011 | Hwang et al. | | |
| 2017/0125374 A1 * | 5/2017 | Lin | ........................ | B23K 3/029 |
| 2022/0126398 A1 * | 4/2022 | Fettke | .................... | B23K 26/38 |
| 2022/0132714 A1 * | 4/2022 | Fettke | .................... | B23K 26/034 |

FOREIGN PATENT DOCUMENTS

| | | | | | |
|---|---|---|---|---|---|
| CN | 112435950 | A | * | 3/2021 | ........... B32B 43/006 |
| EP | 0949670 | A2 | * | 10/1999 | |
| JP | 01209736 | A | * | 8/1989 | ........... H01L 24/799 |
| JP | 2005005460 | A | | 1/2005 | |
| JP | 2009164310 | A | | 7/2009 | |
| JP | 2011044497 | A | * | 3/2011 | ............. H01L 24/27 |
| JP | 2014007328 | A | * | 1/2014 | ............. H01L 24/74 |
| KR | 20110128695 | A | * | 11/2011 | |
| KR | 1020170024491 | | | 3/2017 | |
| KR | 1020170119271 | | | 10/2017 | |
| KR | 101935518 | | | 1/2019 | |
| KR | 102047445 | | | 11/2019 | |
| KR | 1020200094587 | | | 8/2020 | |
| KR | 20220054152 | A | * | 5/2022 | |
| KR | 20220054219 | A | * | 5/2022 | |
| TW | 202222481 | A | * | 6/2022 | ........... B23K 26/037 |

* cited by examiner

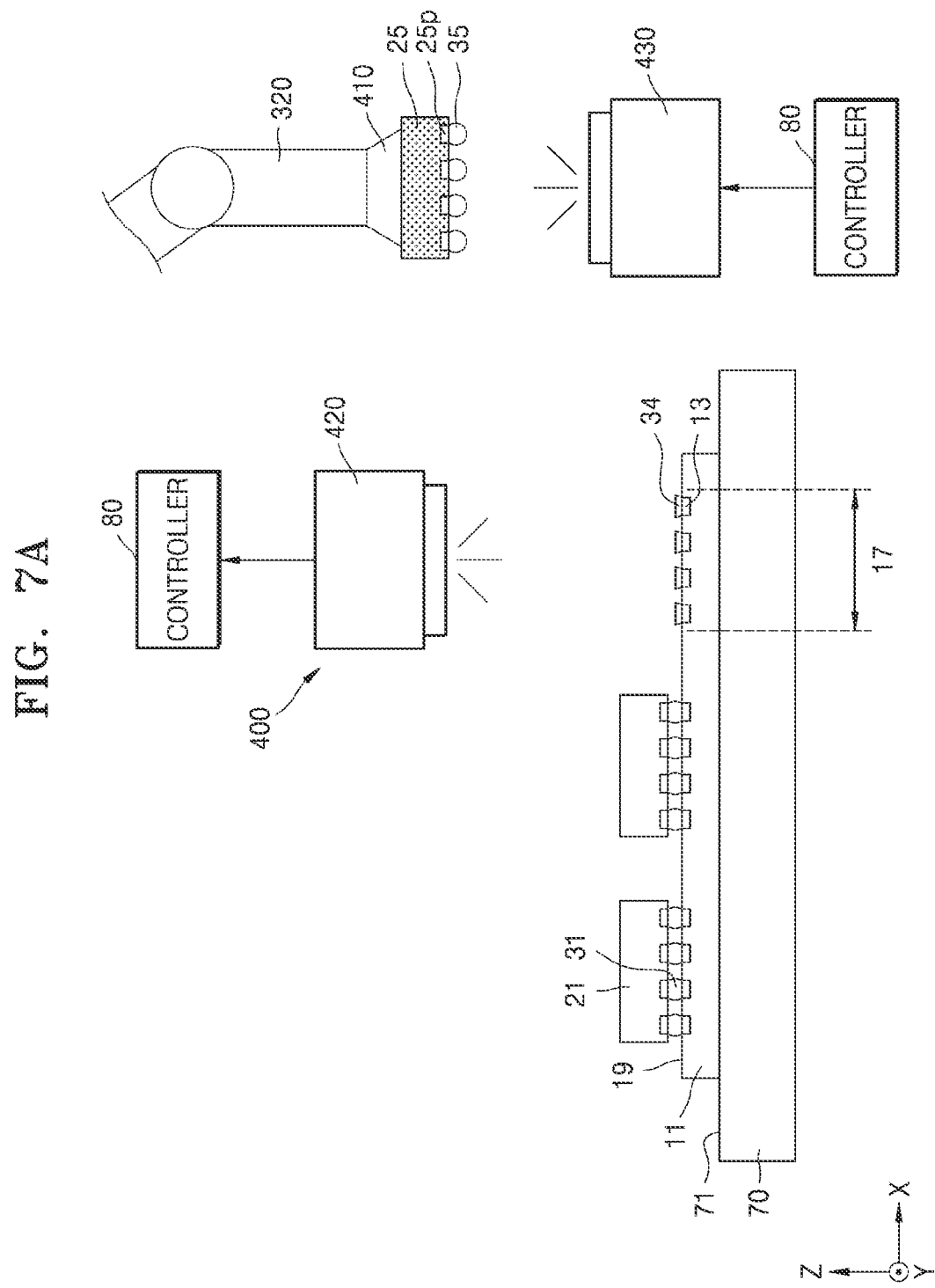

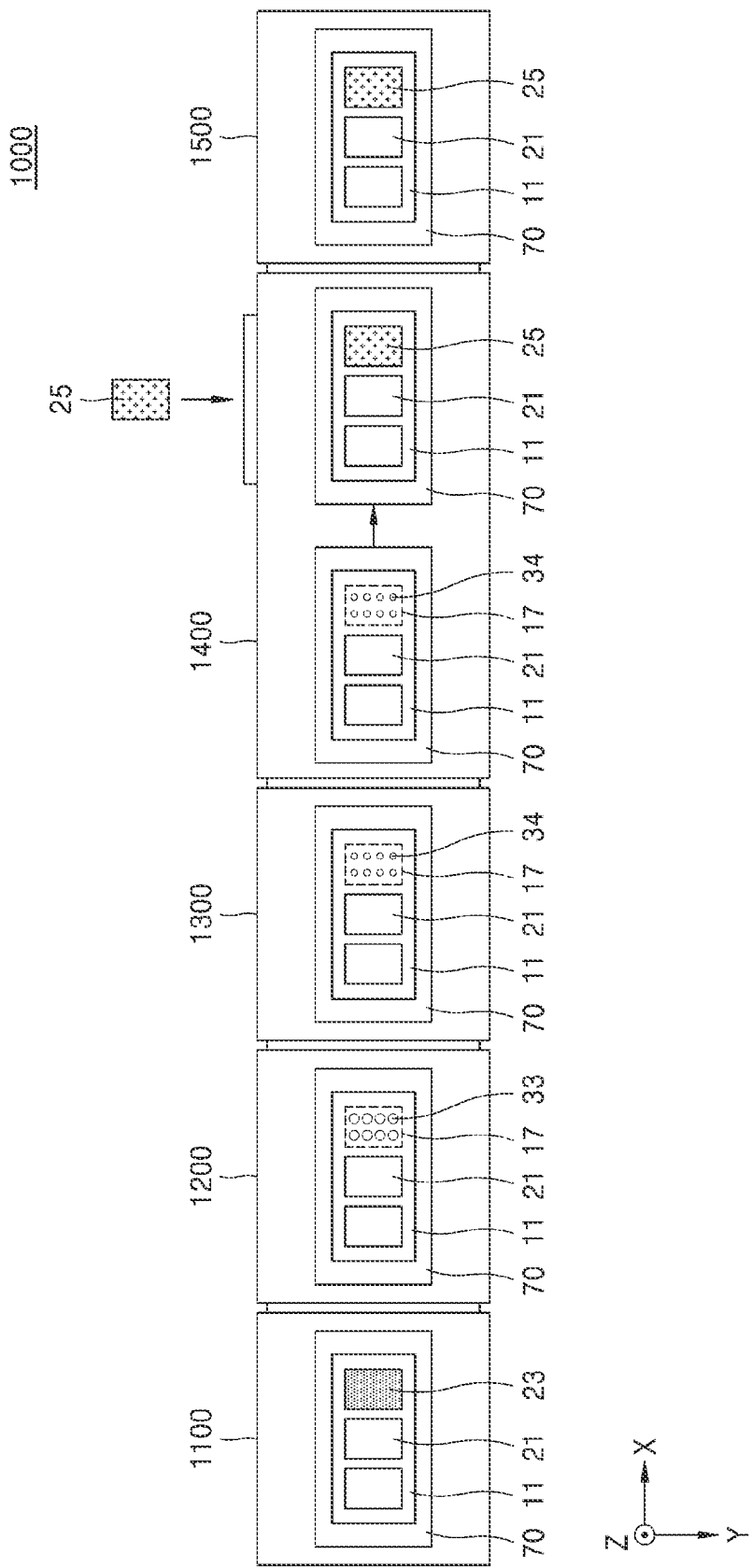

SEMICONDUCTOR MANUFACTURING APPARATUS

CROSS-REFERENCE TO RELATED APPLICATION

This application and claims priority under 35 U.S.C. § 119 to Korean Patent Application No. 10-2021-0038272 filed on Mar. 24, 2021 in the Korean Intellectual Property Office, the subject matter of which is hereby incorporated by reference in its entirety.

BACKGROUND

The inventive concept relates generally to semiconductor manufacturing apparatuses, and more particularly, to semiconductor manufacturing apparatuses capable of performing a repair process that replaces a defective semiconductor component (hereafter simply, "component") on a semiconductor module with a new component.

Semiconductor modules such as a semiconductor memory device (e.g., a solid-state drive or SSD) typically include multiple components variously arranged and mounted on a substrate. Such components include, for example, a ball grid array-type semiconductor package.

During their manufacture, semiconductor modules are routinely subjected to various testing procedures that determine whether the semiconductor module or one of its constituent components is defective. If a particular component on a semiconductor module is identified as defective (e.g., the component has intrinsically failed, or its mounting connection mechanism(s) (e.g., a conductive bump) have failed), a repair process may be perform on the semiconductor module. In this regard, the repair process may replace one or more defective component(s) with corresponding non-defective (or "new") component(s).

However, current repair processes apply considerable thermal energy (e.g., heat) to portion(s) of a semiconductor module undergoing repair, and such heating may damage the substrate, other components proximate to the defective component and/or various wiring on the substrate. Further, current repair processes often require manual intervention to accomplish the repair of a semiconductor module, and such manual intervention varies in quality and competency according to the training and experience of the worker providing the manual intervention. Accordingly, current repair processes tend to generate a wide and unpredictable range of repair outcomes, and production yield of the semiconductor modules suffers as a result.

SUMMARY

Embodiments of the inventive concept provide semiconductor manufacturing apparatuses capable of performing repair processes providing improved and more predictable yields. However, benefits provided by the inventive concept are not limited to only the foregoing.

According to one aspect of the inventive concept, there is provided a semiconductor manufacturing apparatus including: a component separating apparatus configured to separate a defective component from a substrate, a bump conditioning apparatus including an end mill cutter and receiving the substrate following separation of the defective component from the substrate, the bump conditioning apparatus being configured to cut a first connection bump using the end mill cutter to provide a conditioned first connection bump, and the first connection bump being exposed by separating the defective component from the substrate, and a component attaching apparatus configured to receive the substrate following provision of the conditioned first connection bump, and mount a new component including a second connection bump to the substrate by coupling the second connection bump and the conditioned first connection bump.

According to another aspect of the inventive concept, there is provided a semiconductor manufacturing apparatus including; a component separating apparatus configured to separate a defective component from a substrate, a bump conditioning apparatus configured to receive the substrate following separation of the defective component from the substrate, and cut a first connection bump to a target height to provide a conditioned first connection bump, wherein the first connection bump is exposed by separating the defective component from the substrate, and a component attaching apparatus configured to receive the substrate following provision of the conditioned first connection bump, and mount a new component including a second connection bump to the substrate by coupling the second connection bump and the conditioned first connection bump. Here, the component separating apparatus may include a frame, an aperture including an opening, wherein the aperture is disposed in a bottom surface of the frame, a laser light source configured to generate a laser beam, and irradiate the defective component with the laser beam through the frame and the opening of the aperture, and a suction pump configured to apply a suction force to the defective component through the frame and the opening of the aperture to separate the defective component from the substrate.

According to another aspect of the inventive concept, there is provided a semiconductor manufacturing apparatus including; a loading stage configured to load a semiconductor module, wherein the semiconductor module includes a substrate and a defective component mounted on a mounting region of the substrate through a first connection bump, a component separating stage configured to receive the semiconductor module from the loading stage and separate the defective component from the substrate, wherein the first connection bump is exposed by separating the defective component from the substrate, a bump conditioning stage configured to receive the semiconductor module from the component separating stage and remove part of the first connection bump to provide a conditioned first connection bump having a target height, and a component attaching stage configured to receive the semiconductor module following provision of the conditioned first connection bump, and mount a new component including a second connection bump to the substrate by coupling the second connection bump and the conditioned first connection bump. Here, the component separating stage may include; a frame, an aperture including an opening, wherein the aperture is disposed in a bottom surface of the frame, a laser light source configured to generate a laser beam, and irradiate the defective component with the laser beam through the frame and the opening of the aperture, and a suction pump configured to apply a suction force to the defective component through the frame and the opening of the aperture to separate the defective component from the substrate, and the bump conditioning stage may include; a spindle, an end mill cutter mounted on the spindle and configured to cut the first connection bump while laterally moving parallel to an upper surface of the substrate, and a height sensor configured to detect a height in relation to the upper surface of the substrate.

BRIEF DESCRIPTION OF THE DRAWINGS

The making and use of the inventive concept will be better understood upon consideration of the following detailed description together with the accompanying drawings in which:

FIGS. 7A, 7B and 7C (hereafter collectively, "FIGS. 7A to 7C") are block diagrams illustrating a component attaching apparatus of a semiconductor manufacturing apparatus according to embodiments of the inventive concept;

FIG. 9 is a block diagram illustrating a semiconductor manufacturing apparatus according to embodiments of the inventive concept.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1A:
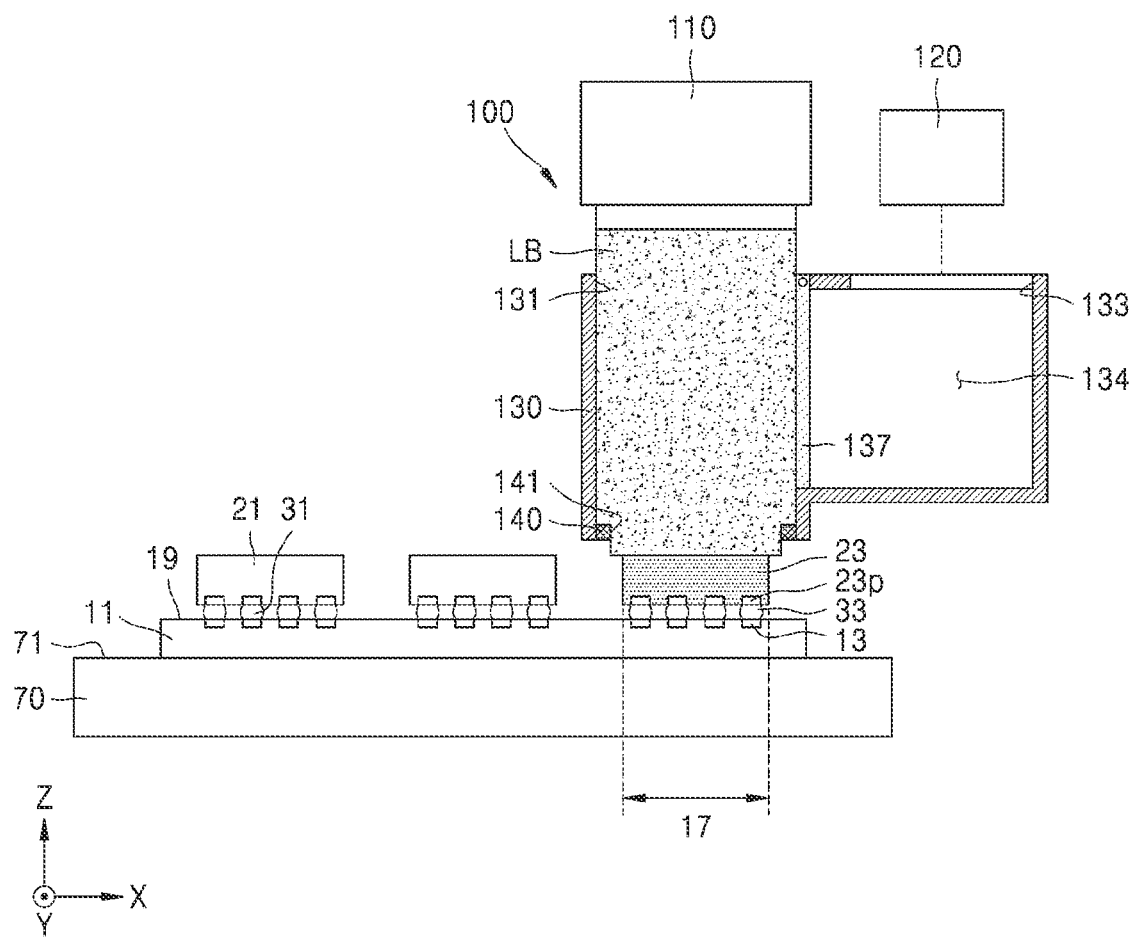
FIGS. 1A, 1B and 1C (hereafter collectively, "FIGS. 1A to 1C") are block diagrams illustrating a component separating apparatus of a semiconductor manufacturing apparatus according to embodiments of the inventive concept.
Figure 1B:
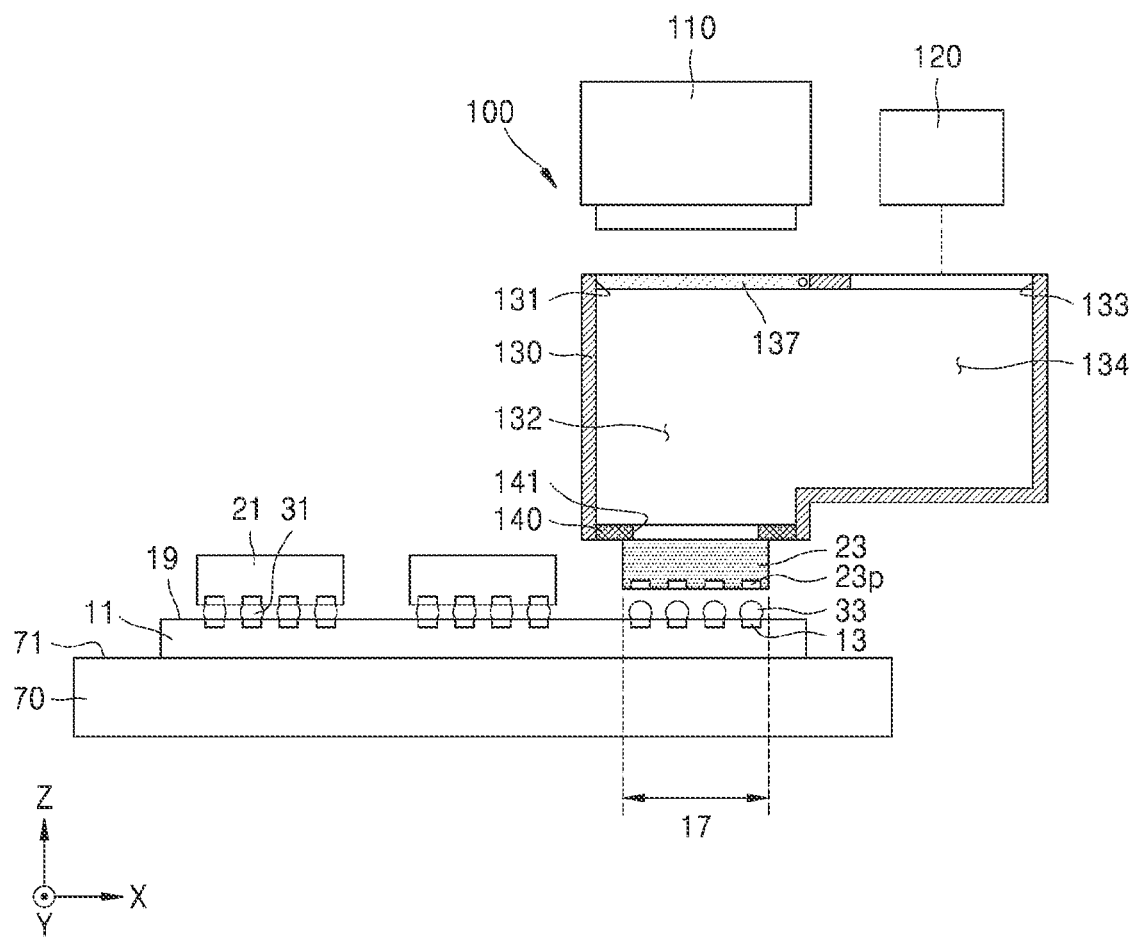
Figure 1C:
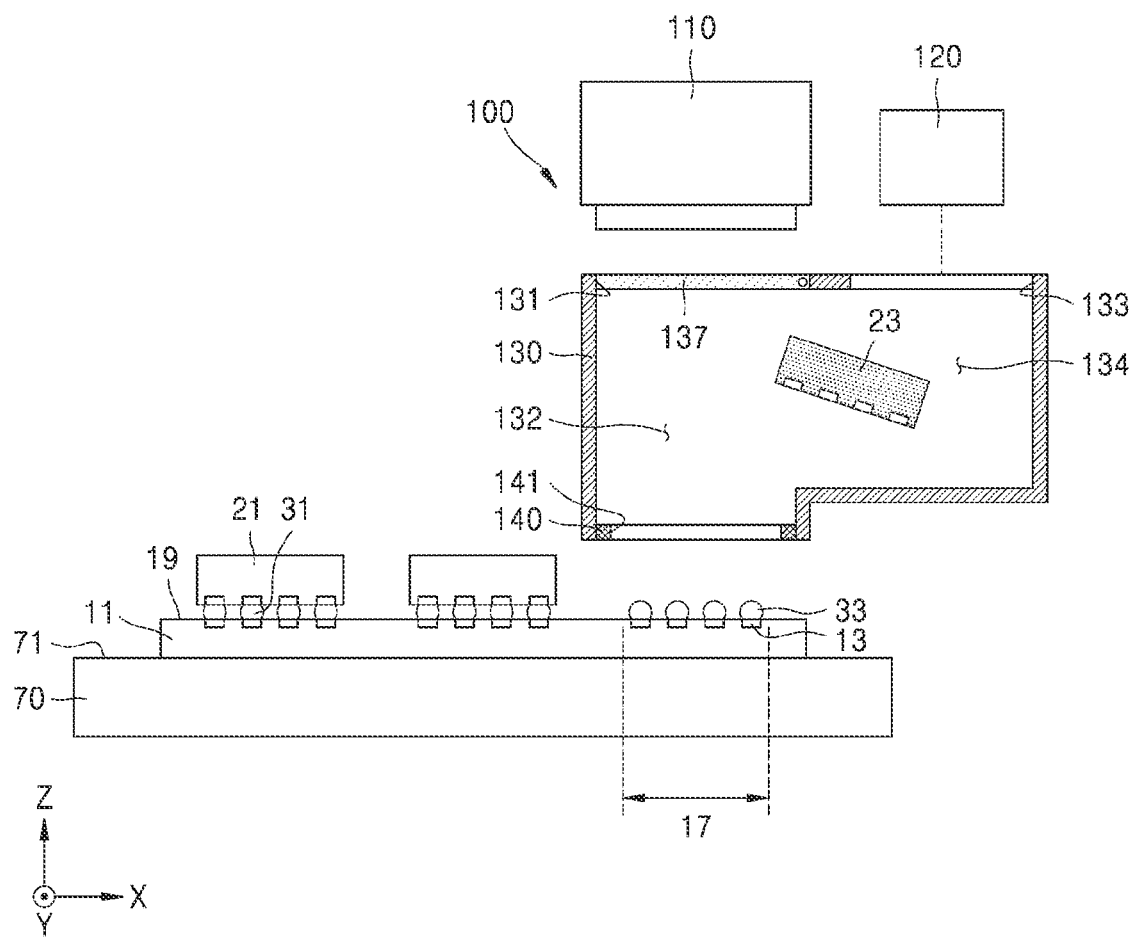
Figure 2:
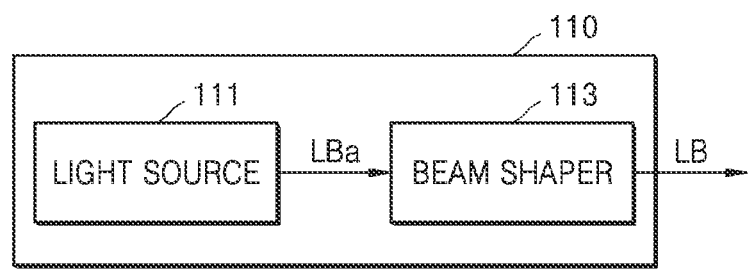
FIG. 2 is a general block diagram illustrating a laser generator that may be used in the component separating apparatus of FIGS. 1A to 1C.

FIGS. (FIGS.) 1A to 1C are block diagrams illustrating a component separating apparatus 100 of a semiconductor manufacturing apparatus according to embodiments of the inventive concept, and FIG. 2 is a block diagram further illustrating in one example the laser generator 110 of the component separating apparatus 100 of FIGS. 1A to 1C.

Referring to FIGS. 1A to 1C, and FIG. 2, the component separating apparatus 100 may perform a component separation process that effectively separates a defective component 23 from a substrate 11 of a semiconductor module. In this context, the term "defective component" broadly denotes any component being replaced on a substrate for any reason. Thus, a defective component may be a component that has failed a performance test, or a component that is merely being replaced regardless of performance.

In some embodiments, the component separating apparatus 100 may selectively heat first connection bumps 33 connecting (or mounting) the defective component 23 to the substrate 11. Such selective heating is designed to raise the temperature of the constituent material(s) of the first connection bumps 33 to at least its melting point. Then, a mechanical force may be applied to the defective component 23 to separate it from the substrate 11.

In its operation, the component separating apparatus 100 may be disposed above a jig 70 on which the semiconductor module is mounted. For example, the jig 70 may be configured to "seat" (e.g., fixing and support at a particular position or orientation) the substrate 11 on an upper surface 71 of the jig 70. In some embodiments, the jig 70 may apply a seating vacuum pressure to the substrate 11. In other embodiments, the jig 70 may include clamp member capable of appropriately seating the substrate 11 on the jig 70.

Here, it should be noted that the semiconductor module seated on the jig 70 includes the substrate 11 (e.g., a printed circuit board or PCB) and at least one component mounted on the substrate 11. In this context, the term "mount" (or "mounting" or "mounted") denotes a mechanical assembly and/or an electrical connection between a substrate of any type and a component of any type.

Here, the component may be a semiconductor chip, such as a memory chip or a logic chip. Alternately or additionally, the component may be a semiconductor package including one or more semiconductor chip(s). For example, the component may be a ball grid array-type semiconductor package.

As noted above, the defective component 23 may have been identified through quality and/or reliability test procedures (hereafter, "testing") performed on the semiconductor module. In this regard, the semiconductor module may include a non-defective (e.g., properly operating) component 21 and the defective component 23, as determined by the testing. In the working example, the non-defective component 21 may be mounted on the substrate 11 through connection bumps 31, and the defective component 23 may be mounted on the substrate 11 through the first connection bumps 33.

In this regard, the structure and composition of the connection bumps may vary by design. For example, in FIGS. 1A to 1C, the first connection bumps 33 may be disposed between a connection pad 23p of the defective component 23 and a connection pad 13 of the substrate 11. The connection bumps 31 and the first connection bumps 33 may include one or more conductive material(s). For example, the connection bumps 31 and the first connection bumps 33 may be solder balls, and may include one or more of tin (Sn), silver (Ag) and copper (Cu).

The component separating apparatus 100 may include a laser generator 110, a suction pump 120, a frame 130 and an aperture 140.

Here, the laser generator 110 may output a laser beam LB. That is, the laser generator 110 may be configured to irradiate the laser beam LB towards the defective component 23 once it is positioned in a mounting region 17. The laser beam LB output from the laser generator 110 may be used to selectively heat the first connection bumps 33 between the defective component 23 and the substrate 11. Thus, the laser generator 110 may perform localized heating on a target region (e.g., the mounting region 17) using the laser beam LB. The laser generator 110 may perform localized heating on the defective component 23, thereby reducing potential thermal damage to an area surrounding the defective component 23 on the substrate 11 while adequately heating the first connection bumps 33 and the defective component 23.

In some embodiments like the one illustrated in FIG. 2, the laser generator 110 may include at least one first laser light source 111 and a beam shaper 113. Thus, the first laser light source 111 may output a laser beam LBa which may be the output of a single light source or a combination of laser beams output from multiple light sources. In this regard, the beam shaper 113 may shape the laser beam LBa, such that the laser generator 110 outputs the laser beam LB having a desired shape. Thereafter, the laser beam LB emitted from the beam shaper 113 may be directed into a first opening 131 of the frame 130 using an optical system of mirror(s), prism(s). etc.

In some embodiments, the beam shaper 113 may include a beam homogenizer that homogenizes the laser beam LB a provided by the first laser light source 111. In this manner, the beam homogenizer may ensure that the laser beam LBa has a uniform intensity profile. For example, the first laser light source 111 may output the laser beam LBa having a Gaussian intensity profile, and the beam shaper (e.g., the beam homogenizer) may convert the Gaussian intensity profile into a uniform intensity profile. In some embodiments, the beam homogenizer may include a microlens-based beam homogenizer and/or a spherical aberration-based beam homogenizer. Because the intensity is uniform over a cross-section of the laser beam LB homogenized in the beam homogenizer, the first connection bumps 33 disposed between the defective component 23 and the substrate 11 may be heated in a substantially uniform manner.

The suction pump 120 may be used to provide a suction force necessary to mechanically separate the defective component 23 from the substrate 11. In some embodiments, the suction pump 120 may selectively apply a vacuum pressure to an inner space defined by the frame 130 and proximate to an upper surface of the defective component 23. Thus, the suction pump 120 may effectively apply vacuum pressure (e.g., a pressure lower than an ambient pressure surrounding the defective component 23) to the upper surface of the defective component 23. Once the first connection bumps 33 have been heated to at least their melting point by application of the laser beam LBa, the defective component 23 may be separated from the first connection bumps 33 by the suction force provided by the suction pump 120.

In the illustrated example of FIGS. 1A to 1C, the frame 130 may be arranged above the substrate 11 and the jig 70, and connected to an actuator that moves the frame 130 above the substrate 11. That is, the frame 130 may be configured to move in a first horizontal direction (e.g., the X direction) and/or a second horizontal direction (e.g., the Y direction) parallel to an upper surface 19 of the substrate 11. The actuator may also move the frame 130 in a vertical direction (e.g., the Z direction) perpendicular to the upper surface 19 of the substrate 11.

The frame 130 may include the first opening 131 receiving the laser beam LB output from the laser generator 110, and a first passage 132 extending from the first opening 131 to an opening 141 of the aperture 140. The first passage 132 may generally extend in the vertical direction, and the laser beam LB output from the laser generator 110 may radiate through the first passage 132 to be emitted at the opening 141 of the aperture 140.

The frame 130 may also include a second opening 133 connected to the suction pump 120, and a second passage 134 extending between the second opening 133 and the first passage 132. A suction force generated by the suction pump 120 may be applied to the upper surface of the defective component 23 through the second passage 134 and the first passage 132.

The frame 130 may include a gate 137 that closes to a first position separating the first passage 132 from the second passage 134, or opens to a second position connecting the first passage 132 with the second passage 134. When closed in the first position, the gate 137 may open the first opening 131. When opened in the second position, the gate 137 may connect the first passage 132 with the second passage 134. In some embodiments, the gate 137 may be pivotably secured (e.g., hinged) to the frame 130 in order to smoothly pivot between the first position and the second position. In this regard, the pivoting (e.g., opening and closing) of the gate 137 may be controlled by an actuator.

As shown in FIG. 1A, the gate 137 may be closed in the first position while the first connection bumps 33 are heated by application of the laser beam LB output from the laser generator 110. That is, when the gate 137 is in the first position, the first opening 131 is opened such that the gate 137 will not block or interfere with the laser beam LB radiating through the first passage 132.

As shown in FIG. 1B, the gate 137 may be opened in the second position while the suction pump 120 generates the suction force applied to the defective component 23. When the gate 137 is in the second position, the first opening 131 is closed and the first passage 132 is effectively connected with the second passage 134. In this manner, the suction force generated by the suction pump 120 may be applied to the defective component 23, such that the defective component 23 is lifted upward from the substrate 11 and onto lower edges of the frame 130 defining the aperture 140.

In this regard, the aperture 140 may be provided on a bottom portion of the frame 130 facing the upper surface 19 of the substrate 11 to essentially form a lower end of the first passage 132. Here, the aperture 140 may include the opening 141 having an adjustable size and/or shape (e.g., a rectangular opening). In some embodiments, the aperture 140 may include a plurality of movable segments, such that the size and shape of the opening 141 may be defined by an arrangement of the segments. While (or before) the laser beam LB is generated by the laser generator 110, the size and/or shape of the opening 141 of the aperture 140 may be adjusted to define an irradiation area through which the laser beam LB is irradiated onto the defective component 23 and the first connection bumps 33.

In some embodiments, while the suction force is provided by the suction pump 120 through the frame 130, the size and/or shape of the opening 141 of the aperture 140 may adjusted to further control the strength (or magnitude) of the suction force applied to the defective component 23.

Hereinafter, a component separation process that may be performed by the component separating apparatus 100 of FIGS. 1A to 1C will be described in some additional detail.

Referring to FIG. 1A, the substrate 11 including the defective component 23 may be mounted on the jig 70, and the component separating apparatus 100 may be aligned over the defective component 23. The component separating apparatus 100 may be positioned such that the opening 141 of the aperture 140 overlaps (at least in part) the defective component 23 in the vertical direction.

Once the component separating apparatus 100 is properly aligned over the defective component 23, the laser generator 110 may generate the laser beam LB. While the laser beam LB is generated, the gate 137 may be closed in the first position to open the first opening 131. When applied, the laser beam LB heats the first connection bumps 33 between the defective component 23 and the substrate 11 for a predetermined period of time (e.g., a "heating time" ranging from between about several seconds to about several tens of seconds) until the first connection bumps 33 are heated to at least their melting point temperature. While the laser beam LB heats the first connection bump 33, the size and/or shape of the opening 141 of the aperture 140 may be adjusted in relation to the a planar area occupied by the defective component 23. For example, a first width of the opening 141 in the first horizontal direction and a first length of the opening 141 the second horizontal direction may be, respectively, greater than or equal to a second width of the defective component 23 in the first horizontal direction and a second length of the defective component 23 in the second horizontal direction.

Referring to FIG. 1B, when the first connection bumps 33 are heated to at least the melting point temperature, the gate 137 may close (e.g., pivot) from the first position to the second position in order to close the first opening 131. At about this time, the size and/or shape of the opening 141 of the aperture 140 may again be adjusted to be less than the planar area of the defective component 23. That is, the first width and first length of the aperture 140 may be, respectively, less than the second width and the second length of the defective component 23.

After adjusting the position of the gate 137 and the size of the opening 141 of the aperture 140, the vacuum pressure generated by the suction pump 120 may be effectively communicated through the frame 130. Under the influence of the suction force generated by the suction pump 120 in this manner, the defective component 23 may be separated (e.g., lifted) from the first connection bumps 33 to contact (e.g., suction adhere to) the outer edges of the aperture 140.

Referring to FIG. 1C, once the defective component 23 has been successfully separated from the first connection bumps 33, the opening 141 of the aperture 140 may again be adjusted (e.g., expanded) to allow the defective component 23 to be sucked away from the substrate 11 and into the frame 130 under the continued influence of the vacuum pressure.

Here, it should be noted that in certain comparative component separation processes, after a blast of heated air is applied to the substrate 11 to melt connection bumps, an external mechanical force may be applied to a defective component in order to separate the defective component from the substrate 11. However, the blast of heated air may thermally damage the substrate 11 and/or other components proximate to the defective component. Further, application of a mechanical force may also damage the substrate 11 and/or other components proximate to the defective component.

In contrast, embodiments of the inventive concept apply well-controlled, localized heating to cut the first connection bumps 33, and then apply a gentle upward, vacuum pressure to the defective component 23 to safely remove it from the substrate 11. Accordingly, little or no thermal and/or mechanical damage is inflicted upon the substrate 11 or other components proximate to the defective component 23.

Figure 3A:
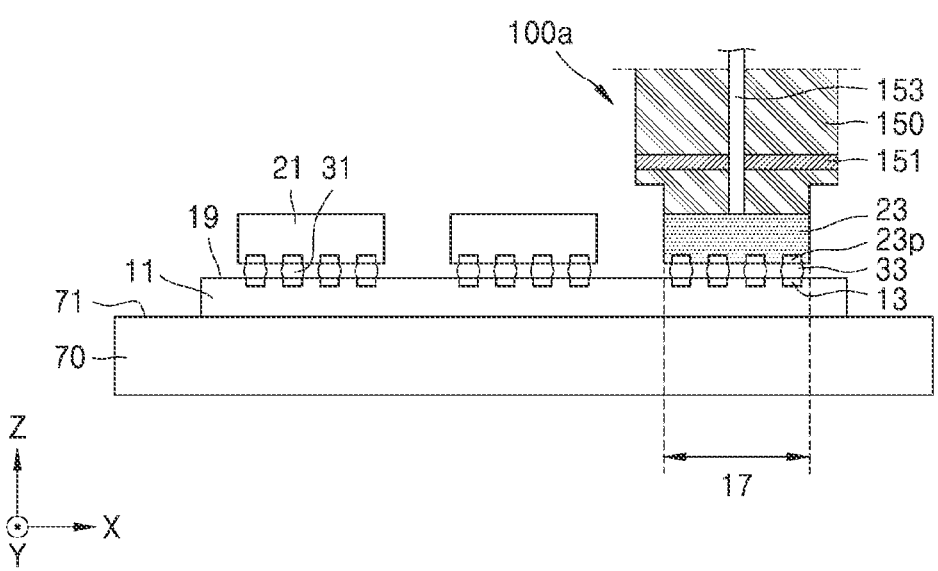
FIGS. 3A and 3B are block diagrams illustrating a component separating apparatus of a semiconductor manufacturing apparatus according to embodiments of the inventive concept.
Figure 3B:
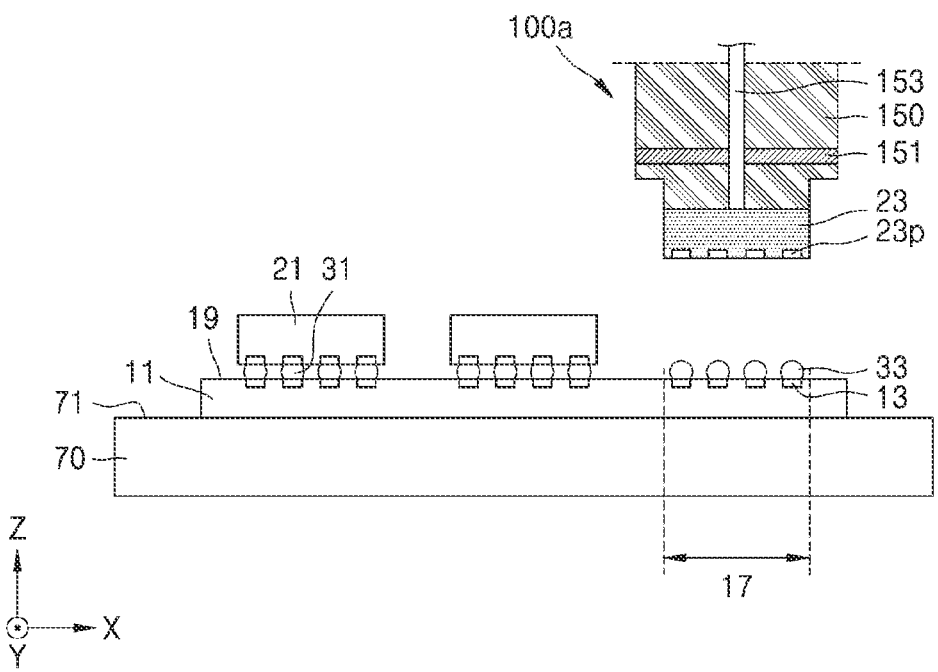

FIGS. 3A and 3B are block diagrams illustrating a component separating apparatus 100a of a semiconductor manufacturing apparatus according to embodiments of the inventive concept.

Hereinafter, only material differences between the component separating apparatus 100a of FIGS. 3A and 3B and the component separating apparatus 100 of FIGS. 1A to 1C will be described in detail.

In FIGS. 3A and 3B, the component separating apparatus 100a may include a heating block 150 including a heating element 151. The heating element 151 may include various types of electric heaters capable of electrically generating thermal energy (e.g., heat), such as a planar heating element, a hot wire-type or a coil-type heating element. The heating block 150 may be connected to an actuator allowing lateral (e.g., in the first horizontal direction and/or the second horizontal direction) and vertical (e.g., in the vertical direction) movement with respect to the substrate 11.

The heating block 150 may be configured to melt the first connection bumps 33 by applying heat (e.g., thermally conducting heat) to the defective component 23. For example, the heating block 150 may melt the first connection bumps 33 by applying heat through an upper surface of the defective component 23 which is placed in contact with the heating block 150. Because the heating block 150 may perform selective, localized heating of only the defective component 23, the risk of thermal damage to the substrate 11 and other components proximate to the defective component 23 may be reduced.

In addition, the heating block 150 may include a suction line 153 connected to a suction pump (e.g., the suction pump 120 of FIGS. 1A to 1C). The suction line 153 may extend through a bottom surface of the heating block 150 in contact the defective component 23. When vacuum pressure is applied to the defective component 23 through the suction line 153, the defective component 23 may be lifted from the substrate 11 by the heating block 150. That is, when the first connection bumps 33 are heated to at least the melting point temperature by the heating block 150, the defective component 23 may be vacuum-adsorbed by the bottom surface of the heating block 150 using the vacuum force provided through the suction line 153. Accordingly, as the heating block 150 is lifted away from the substrate 11, the defective component 23 vacuum-adsorbed on the bottom surface of the heating block 150 may be separated from the first connection bumps 33.

In FIGS. 3A and 3B, the defective component 23 may be separated from the substrate 11 using the suction line 153 extending through the heating block 150. However, in other embodiments, the suction line 153 may be omitted from the heating block 150, and an external force applied to the defective component 23 may be used separate from the heating block 150 in order to separate the defective component 23 from the substrate 11.

However, according to embodiments of the inventive concept, because the first connection bumps 33 are heated using a localized heating mechanism, the defective component 23 may be safely separated from the substrate 11 without undue risk of thermal damage to the substrate 11 or other components proximate to the defective component 23.

FIGS. 4A to 4D are block diagrams illustrating a bump conditioning apparatus 200 of a semiconductor manufacturing apparatus according to embodiments of the inventive concept.

Referring to FIGS. 4A to 4D, the bump conditioning apparatus 200 may be used to remove at least part of one of the first connection bumps 33 (hereafter, "first connection bump 33") in order to perform a bump conditioning process that properly shapes the first connection bump 33. The bump conditioning process may be referred to as a bump dressing process. For example, when the substrate 11 from which the defective component 23 is separated by a component separation process is transferred to the bump conditioning apparatus 200, the bump conditioning apparatus 200 may selectively remove parts of one or more of the first connection bumps 33 exposed by the separation of the defective component 23. That is, the bump conditioning apparatus 200 may remove or cut away (hereafter, "cut") part of one or more of the first connection bumps 33, such that each one of the first connection bump 33 rises only to a target height HT. Hereafter, a description will be presented in relation to the conditioning of a first connection bump 33, bearing in mind that one, more than one, or all of the first connection bumps may undergo the same conditioning process.

In some embodiments, the bump conditioning apparatus 200 may include a cutting apparatus 210 for cutting the first connection bump 33, such that the first connection bump 33 has the target height HT. In this regard, the bump conditioning apparatus 200 may flatly cut the first connection bump 33. For example, as shown in FIG. 4D, a cut surface (34S) of a first connection bump 34—on which the bump conditioning process has been performed—may have a flat, horizontally planar shape. That is, referring to FIG. 4D, the cut surface 34S of the conditioned first connection bump 34 may be parallel to the upper surface 19 of the substrate 11.

Referring to FIGS. 4A to 4D, the cutting apparatus 210 may perform a milling process on the first connection bump 33. The cutting apparatus 210 may include a spindle 211 and an end mill cutter 213 mounted on the spindle 211. The end mill cutter 213 may be mounted on the spindle 211 to rotate about a vertical axis of rotation. Furthermore, the cutting apparatus 210 may include a Z-axis motor capable of adjusting a vertical position of the spindle 211, and an actuator capable of laterally moving the spindle 211 in the first horizontal direction and/or the second horizontal direction.

Accordingly, as the end mill cutter 213 rotates and the spindle 211 moves laterally in parallel with the upper surface 19 of the substrate 11, an upper portion of the first connection bump 33 may be cut by a peripheral cutting edge of the end mill cutter 213. Alternately, the first connection bump 33 may also be cut using an end cutting edge at a front end of the end mill cutter 213 by moving the spindle 211 downward while the end mill cutter 213 is rotated.

In some embodiments, the cutting of the first connection bump 33 while moving the spindle 211 in a lateral direction may be referred to as "unit cutting." The cutting apparatus 210 may perform multiple passes resulting in multiple unit cuttings while vertically varying a cutting height of the end mill cutter 213 until the first connection bump 33 is cut down to the target height HT. However, in other embodiments, the cutting apparatus 210 may cut the first connection bump 33 to the target height HT using a single unit cutting pass.

In some embodiments, the target height HT of the conditioned first connection bump 34 may range from between about 60 micrometers μm to about 120 μm. In one particular embodiment, the target height HT of the conditioned first connection bump 34 may be about 90 μm.

In some embodiments (and referring briefly to FIG. 7C), the target height HT of the conditioned first connection bump 34 may range from between about 15% to about 40% of a height of a third connection bump 36 between a non-defective component 25 mounted in the mounting region 17 of the substrate 11 using a component attaching process subsequent to the bump conditioning process.

Referring to FIG. 4D, the bump conditioning apparatus 200 may include a suction head 230 capable of removing milled residue generated by the end mill cutter 213 cutting the first connection bump 33. The suction head 230 may be connected to a vacuum pump providing sufficient vacuum pressure to clean residue from the substrate 11. The suction head 230 may remove the residue while the end mill cutter 213 is cutting the first connection bump 33, and/or after the cutting of the first connection bump 33 is complete.

Advantageously, the suction head 230 may also perform a cooling function with respect to the first connection bump 33 by providing a cooling air flow around the first connection bump 33 as it is cut and/or immediately after it is cut. However, in some embodiments, the bump conditioning apparatus 200 may further include a separate cooling apparatus configured to supply cooling air to the first connection bump 33 during the cutting process.

The bump conditioning apparatus 200 may include a height sensor 220 capable of detecting a cutting height. For example, the height sensor 220 may detect the cutting height in relation to the upper surface 19 of the substrate 11. In this regard, the height detector 220 may be able to detect a height of the upper surface 19 of the substrate 11 which has been warped or deformed. Thus, the height sensor 220 may detect a height deformation amount in which the upper surface 19 of the substrate 11 is offset from a reference height. The bump conditioning apparatus 200 may cut the first connection bump 33 to the target height HT using the height deformation amount detected by the height sensor 220. For example, the height sensor 220 may be implemented as a displacement sensor such as a laser type, an Light Emitting Diode (LED) type, an ultrasonic type, a contact type, an eddy current type, etc.

That is, a sensing signal with respect to a height of the substrate 11 detected by the height sensor 220 may be communicated to a controller 80, and the controller 80 may apply a control signal adjusting the cutting height of the end mill cutter 213 to the cutting apparatus 210 based on the sensing signal. The cutting apparatus 210 may vertically adjust the spindle 211 to achieve a desired cutting height for the end mill cutter 213 in response to the control signal. For example, when the vertical position of the upper surface 19 of the substrate 11 rises from a reference position due to deformation in the substrate 11, the cutting height of the end mill cutter 213 may be adjusted in relation to a detected height deformation value for the substrate 11. For example, when the vertical position of the upper surface 19 of the substrate 11 varies from the reference position due to deformation in the substrate 11, the cutting height of the end mill cutter 213 may be adjusted compensate for the variance by the height deformation value. And because the cutting height of the end mill cutter 213 is properly adjusted in relation to the vertical height of the substrate 11, even when the substrate 11 is deformed, the first connection bump 33 may be accurately cut to the target height HT.

In some embodiments, the cutting height of the end mill cutter 213 may be determined by a Z-axis motor that vertically adjusts the position of the spindle 211. For example, the cutting height of the end mill cutter 213 may be determined in relation to an initial position $H_r$ of a spindle synchronized to a previously determined reference height, a first offset value $\Delta V_1$ between a previously determined reference length and a selected length of the end mill cutter 213, a second offset value $\Delta V_2$ between the previously determined reference height and the upper surface 19 of the substrate 11, and an input value $V_i$ with respect to the cutting height of the end mill cutter 213. With respect to the initial position $H_r$ of the spindle, an end of the end mill cutter 213 having a reference length may be located at the previously determined reference height. The first offset value $\Delta V_1$ may be a value for correcting a difference between the length of the selected end mill cutter 213 and the reference length. The second offset value $\Delta V_2$ may be a value detected by the height sensor 220. The input value $V_i$ with respect to the cutting height of the end mill cutter 213 may be an input parameter value. The Z-axis motor may vertically adjust the position of the spindle 211 according to a sum of $H_r$, $\Delta V_1$, $\Delta V_2$, and $V_i$, thereby cutting the first connection bump 33 to the target height.

The controller 80 may be used to control the overall repair process using the semiconductor manufacturing apparatus including a bump conditioning process. The controller 80 may be implemented in hardware, firmware, software, or any combination thereof. For example, the controller 80 may be a computing device such as a workstation computer, a desktop computer, a laptop computer, or a tablet computer. For example, the controller 80 may include a memory device such as read only memory (ROM) and random access memory (RAM), and a processor configured to perform certain operation and algorithm, for example, a microprocessor, a central processing unit (CPU), a graphics processing unit (GPU), etc. In addition, the controller 80 may include a receiver and a transmitter for receiving and transmitting an electrical signal.

Hereinafter, a bump conditioning process using the bump conditioning apparatus 200 will be described in relation to FIGS. 4A to 4D.

Figure 4A:
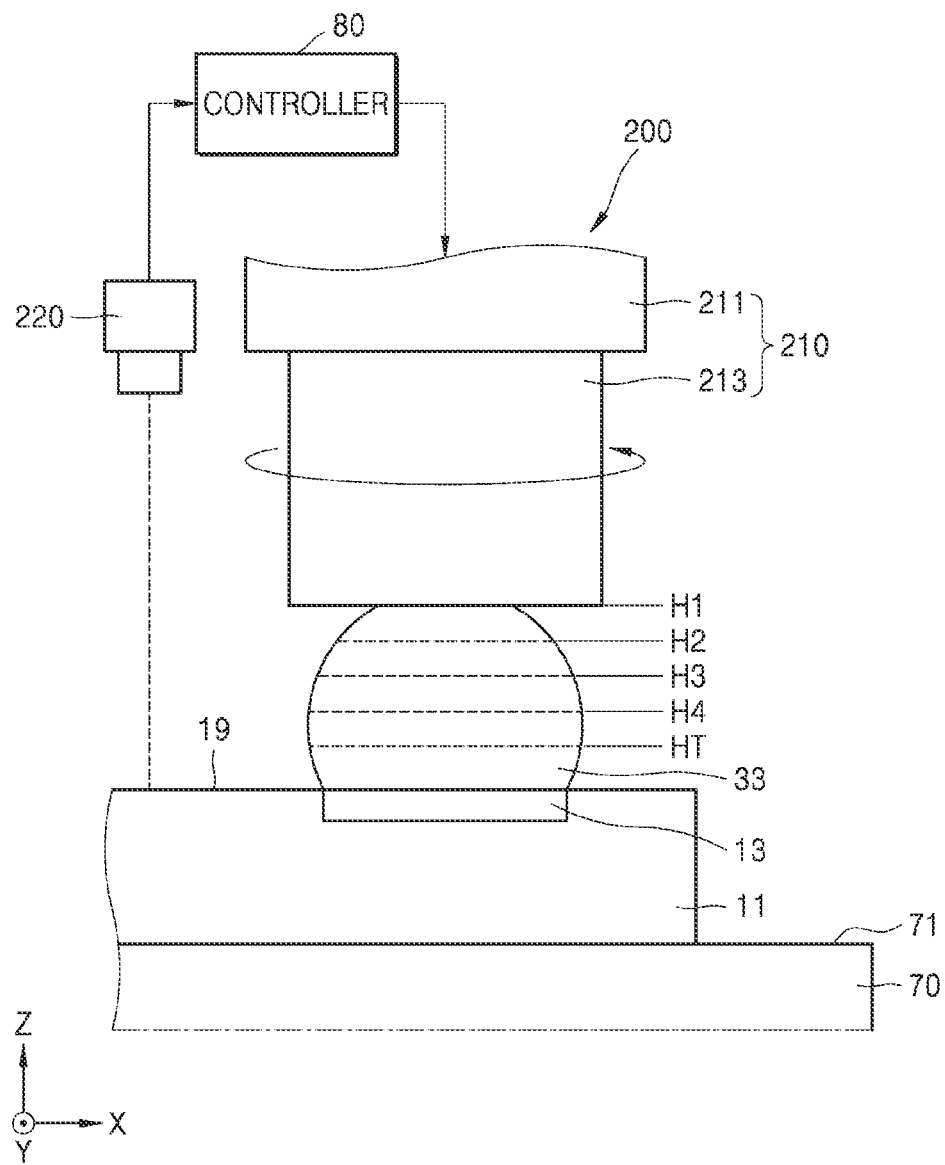
FIGS. 4A, 4B, 4C and 4D (hereafter collectively, "FIGS. 4A to 4D") are block diagrams illustrating a bump conditioning apparatus of a semiconductor manufacturing apparatus according to embodiments of the inventive concept.

Referring to FIG. 4A, the substrate 11, from which the defective component 23 is separated through a component separation process, is transferred to the bump conditioning apparatus 200. The cutting apparatus 210 may adjust the vertical position of the end mill cutter 213 such that an end of the end mill cutter 213 is positioned at a first height H1 from the upper surface 19 of the substrate 11. A cutting height of the end mill cutter 213 may be adjusted based on a change in the height of the upper surface 19 of the substrate 11, as detected by the height sensor 220. When vertical adjustment of the cutting height of the end mill cutter 213 is complete, the end mill cutter 213 may move along a plane at the first height H1 from the upper surface 19 of the substrate 11 while rotating the end mill cutter 213. While the end mill cutter 213 moves at the first height H1, the first connection bump 33 may be cut to develop a cutting surface substantially parallel to the upper surface 19 of the substrate 11.

Figure 4B:
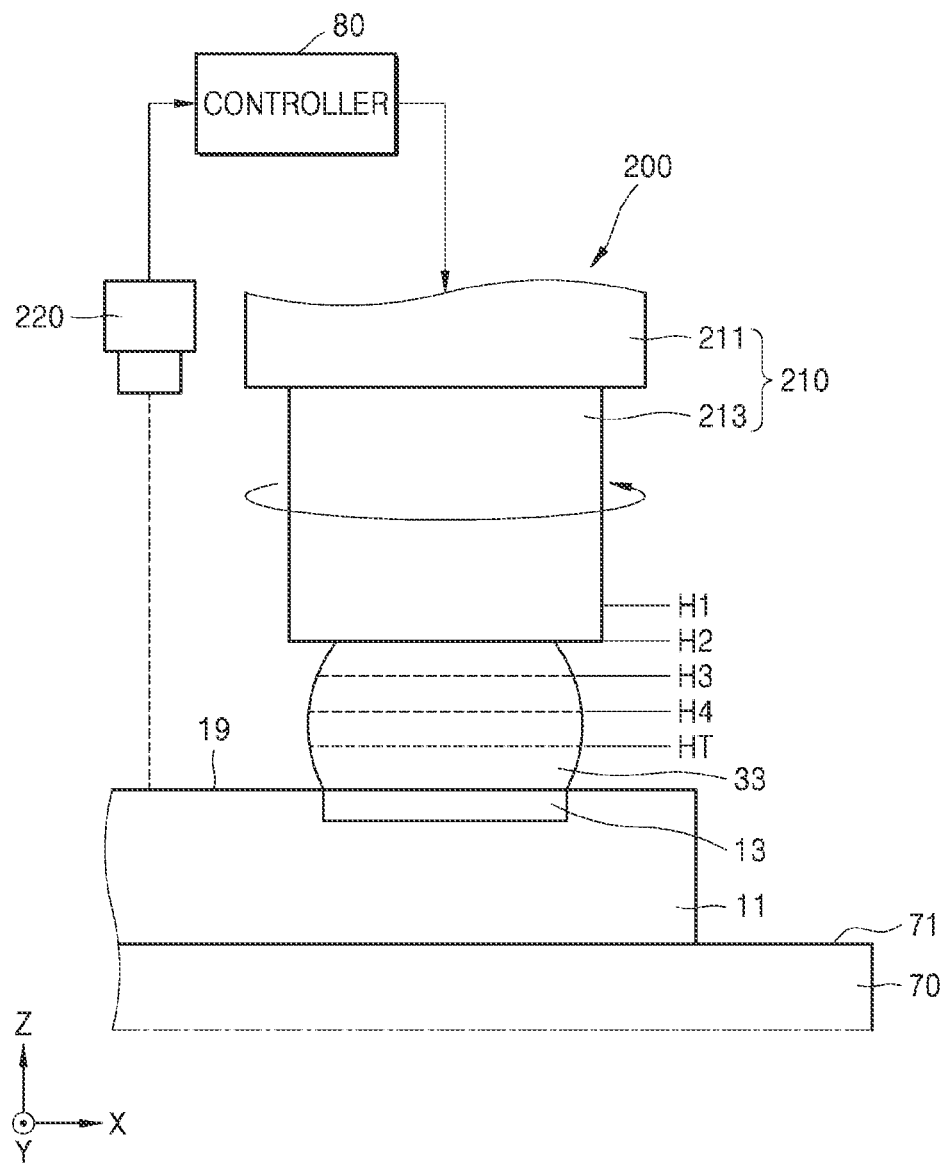

Referring to FIG. 4B, the end mill cutter 213 may vertically descend so that the end of the end mill cutter 213 is positioned at a second height H2 from the upper surface 19 of the substrate 11. Here, the second height H2 may be lower than the first height H1. When the end of the end mill cutter 213 is positioned at the second height H2, the cutting apparatus 210 may move the end mill cutter 213 along a plane at the second height H2 from the upper surface 19 of the substrate 11 while rotating the end mill cutter 213. While the end mill cutter 213 moves at the second height H2, the first connection bump 33 may be cut.

Figure 4C:
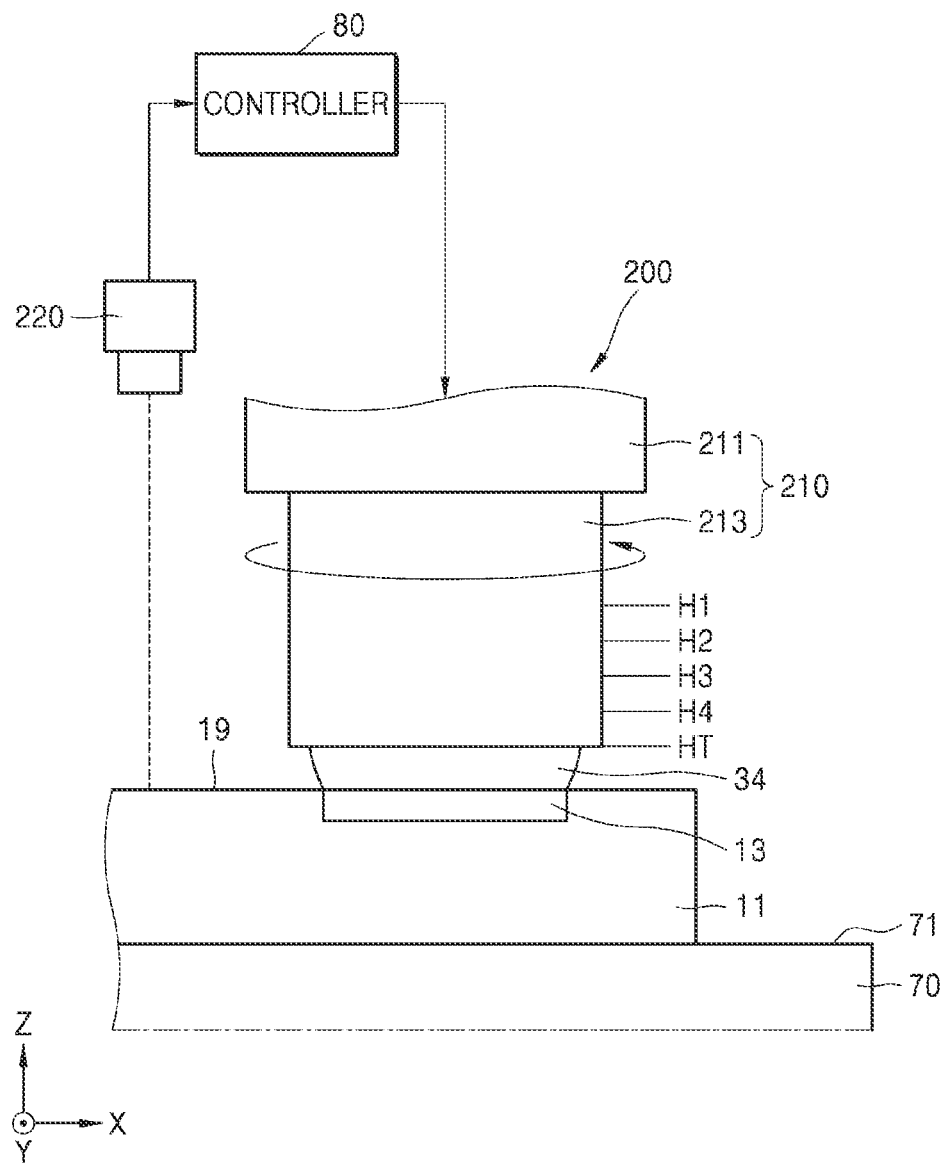
Figure 4D:
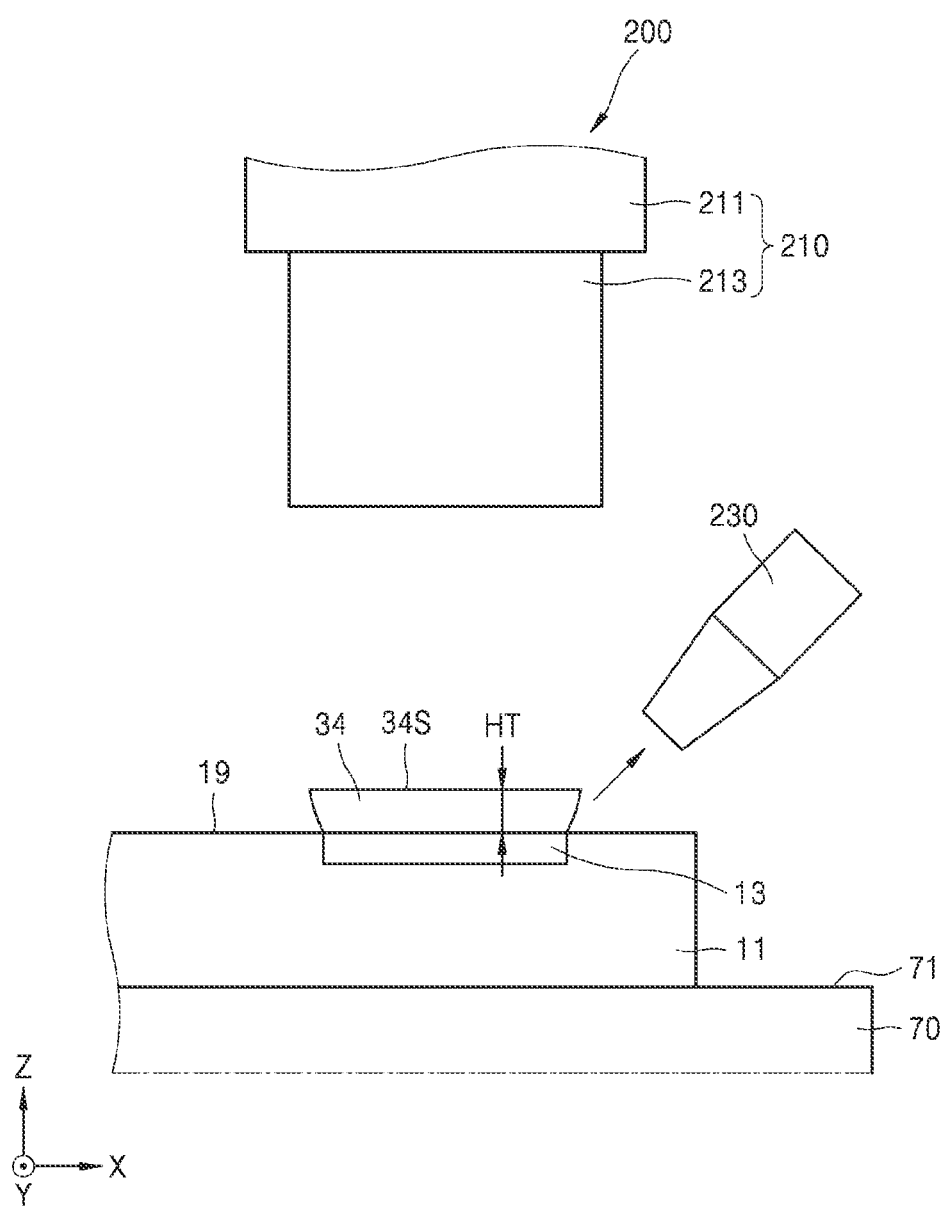

Referring to FIG. 4C, a unit cutting process may be performed several times while adjusting the cutting height of the end mill cutter 213. For example, the cutting apparatus 210 may sequentially perform a unit cutting process that cuts the first connection bump 33 while moving the end mill cutter 213 along a plane at a third height H3 from the upper surface 19 of the substrate 11, a unit cutting process of cutting the first connection bump 33 while moving the end mill cutter 213 along a plane at a fourth height H4 from the upper surface 19 of the substrate 11, and a unit cutting process of cutting the first connection bump 33 while moving the end mill cutter 213 along a plane at the target height HT from the upper surface 19 of the substrate 11. As a result of performing multiple unit cutting processes (or passes), the conditioned first connection bump 34 has the target height HT.

Referring to FIG. 4D, when the first connection bump 33 is conditioned to have the target height HT (thereby forming the conditioned first connection bump 34), milling residue remaining on the substrate 11 may be removed using the suction head 230.

The illustrated example of FIGS. 4A to 4D assumes a case in which a unit cutting process is performed five (5) times until the first connection bump 33 reaches the target height HT of the conditioned first connection bump 34. However, in other embodiments, the first connection bump 33 may be cut to the target height HT by performing a single unit cutting process. Alternately, in other embodiments, the first connection bump 33 may be cut to the target height HT through a unit cutting process 2, 3, 4, 6 or more times.

Here, it should be noted that embodiments of the inventive concept may variously and automatically condition of connection bumps using the bump conditioning apparatus 200, instead of manually conditioning the connection bumps. Because embodiments of the inventive concept use predictable, better-controlled automation to perform a repair process including bump conditioning, the overall repair process provides improved quality and better yield. In addition, the bump conditioning apparatus 200 may reduce the risk of thermal damage to the substrate 11 and components proximate to the defective component(s) removed during the repair process.

FIGS. 5A to 5D are block diagrams illustrating a bump conditioning apparatus 200a of a semiconductor manufacturing apparatus according to embodiments of the inventive concept.

Hereinafter, only material differences between the bump conditioning apparatus 200a of FIGS. 5A to 5D and the bump conditioning apparatus 200 of FIGS. 4A to 4D will be described.

Referring to FIGS. 5A to 5D, the bump conditioning apparatus 200a may include a laser supply head 250 configured to remove part of the first connection bump 33 using a laser beam 251. The laser supply head 250 may include a second laser light source configured to generate and direct the laser beam 251 towards the first connection bump 33, and a condensing lens for adjusting a focal position of the laser beam 251. The laser supply head 250 may be a laser scanning apparatus connected to an actuator capable of laterally and/or vertically moving the laser supply head 250. In this regard, the laser supply head 250 may generate the laser beam 251 while laterally moving across the upper surface 19 of the substrate 11. Further, the laser supply head 250 may be vertically moved to change the focal position of the laser beam 251.

The laser supply head 250 may perform a laser cutting process on the first connection bump 33. The laser supply head 250 may irradiate the first connection bumps 33 with the laser beam 251 having an appropriate level of power suitable for cutting the first connection bumps 33. The laser supply head 250 may adjust a height of the first connection bump 33 by removing part of the first connection bump 33.

In some embodiments, the laser supply head 250 may be configured to generate a nano-second pulsed laser, a pico-second pulsed laser, and/or a femto-second pulsed laser.

The laser supply head 250 may adjust focus of the laser beam 251 across the first connection bump 33 in order to cut the first connection bump 33 while laterally moving parallel to the upper surface 19 of the substrate 11. Accordingly, a cut surface of the cut first connection bump 33 may be substantially parallel to the upper surface 19 of the substrate 11.

In some embodiments, a process in which the laser supply head 250 cuts the first connection bump 33 while laterally moving may be defined as a unit laser cutting process. The laser supply head 250 may perform multiple unit laser cutting processes while varying the focal position of the laser beam 251 until the first connection bump 33 reaches the target height HT.

Hereinafter, a bump conditioning process using the bump conditioning apparatus 200a will be described with reference to FIGS. 5A to 5D.

Figure 5A:
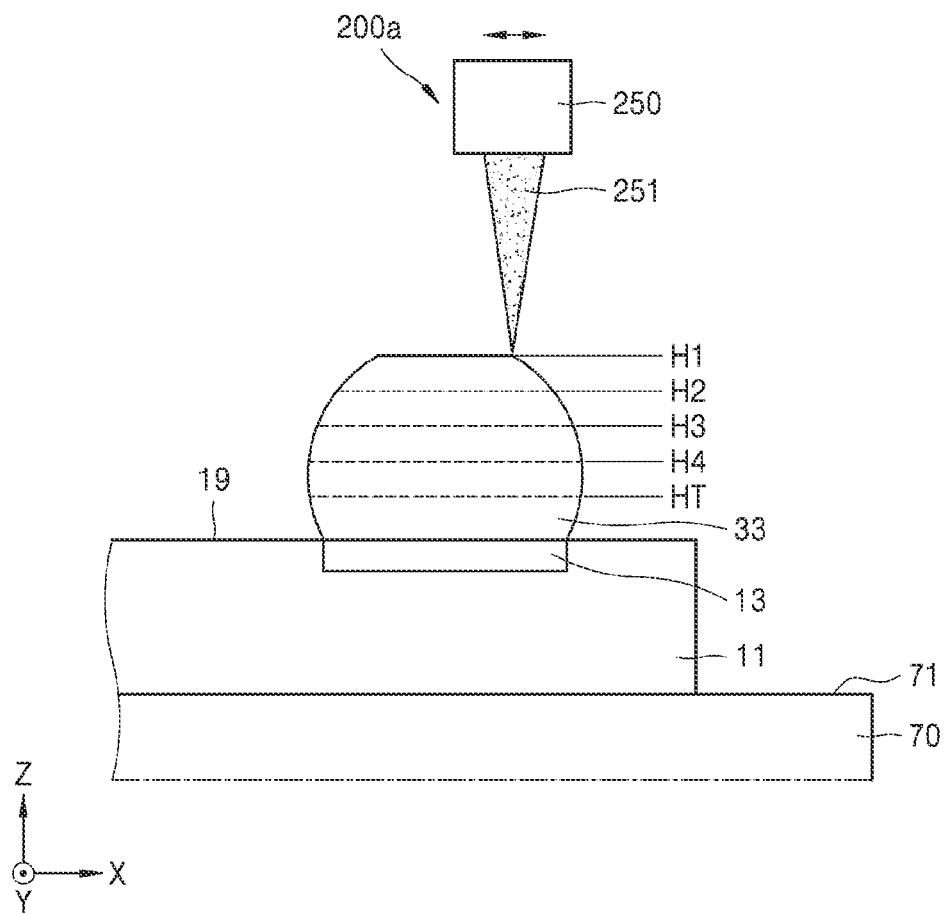
FIGS. 5A, 5B, 5C and 5D (hereafter collectively, "FIGS. 5A to 5D") are block diagrams illustrating a bump conditioning apparatus of a semiconductor manufacturing apparatus according to embodiments of the inventive concept.

Referring to FIG. 5A, the substrate 11 from which the defective component 23 is removed through a component separation process is transferred to the bump conditioning apparatus 200a. The laser supply head 250 may adjust the focal position of the laser beam 251 to be positioned at the first height H1 from the upper surface 19 of the substrate 11. When adjustment of the focal position of the laser beam 251 is completed, the laser supply head 250 may move along a plane at the first height H1 from the upper surface 19 of the substrate 11 in a state in which the laser beam 251 is output. While the laser supply head 250 moves, the first connection bump 33 may be cut to have the first height H1.

Figure 5B:
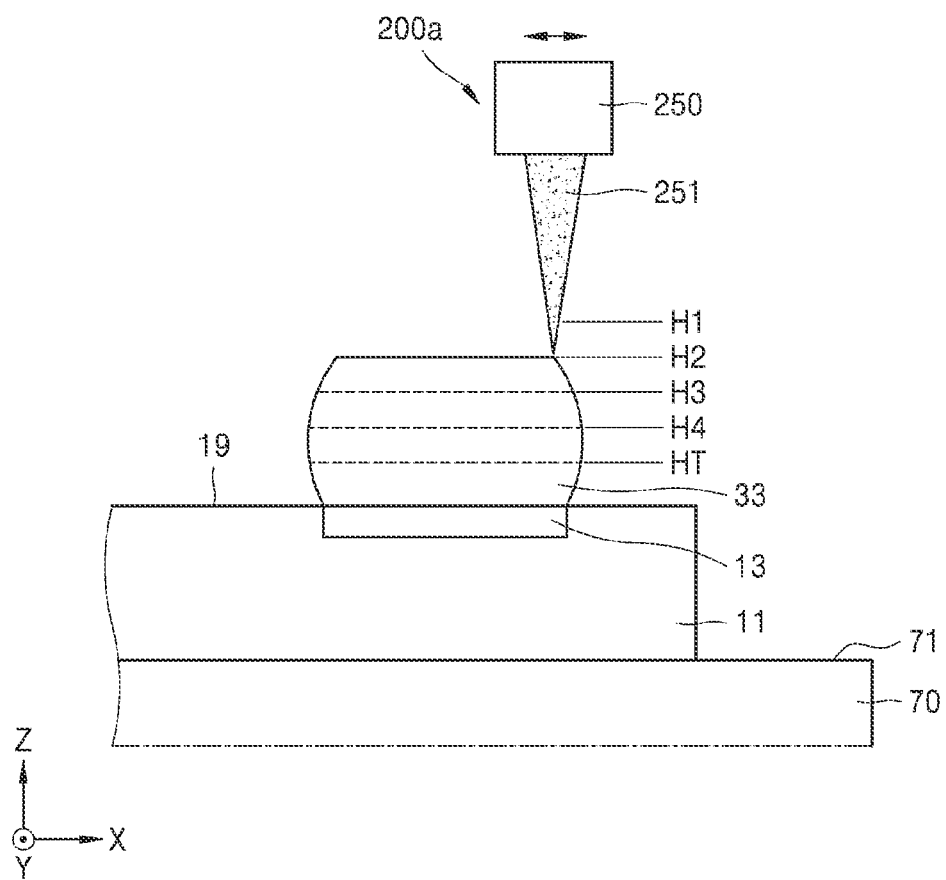

Referring to FIG. 5B, the focal position of the laser beam 251 may be adjusted to be positioned at the second height H2 from the upper surface 19 of the substrate 11. The second height H2 may be lower than the first height H1. When the focal position of the laser beam 251 is positioned at the second height H2, the laser supply head 250 may move along a plane at the second height H2 from the upper surface 19 of the substrate 11 in the state in which the laser beam 251 is output. While the laser supply head 250 moves, the first connection bump 33 may be cut to have the second height H2.

Figure 5C:
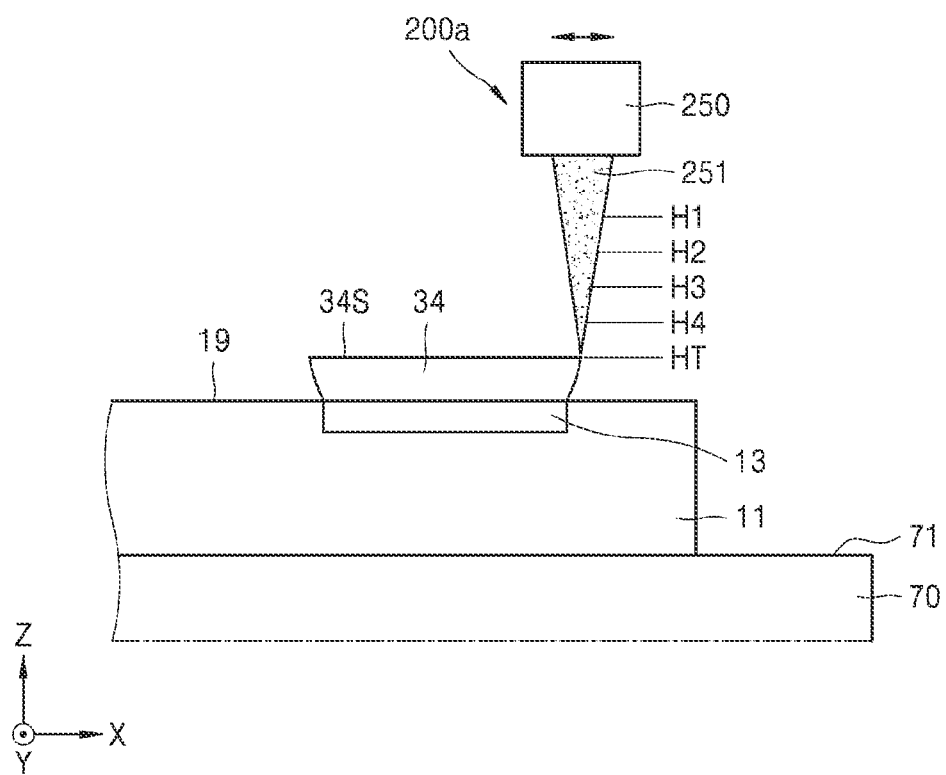

Referring to FIG. 5C, the unit laser cutting process may be performed several times while adjusting the focal position of the laser beam 251. For example, the laser supply head 250 may sequentially perform a unit laser cutting process of cutting the first connection bump 33 while moving along a plane at the third height H3 from the upper surface 19 of the substrate 11, a unit laser cutting process of cutting the first connection bump 33 while moving along a plane at the fourth height H4 from the upper surface 19 of the substrate 11, and a unit laser cutting process of cutting the first connection bump 33 while moving along a plane at the target height HT from the upper surface 19 of the substrate 11. As a result of performing multiple unit laser cutting processes, the conditioned first connection bump 34 has the target height HT.

Figure 5D:
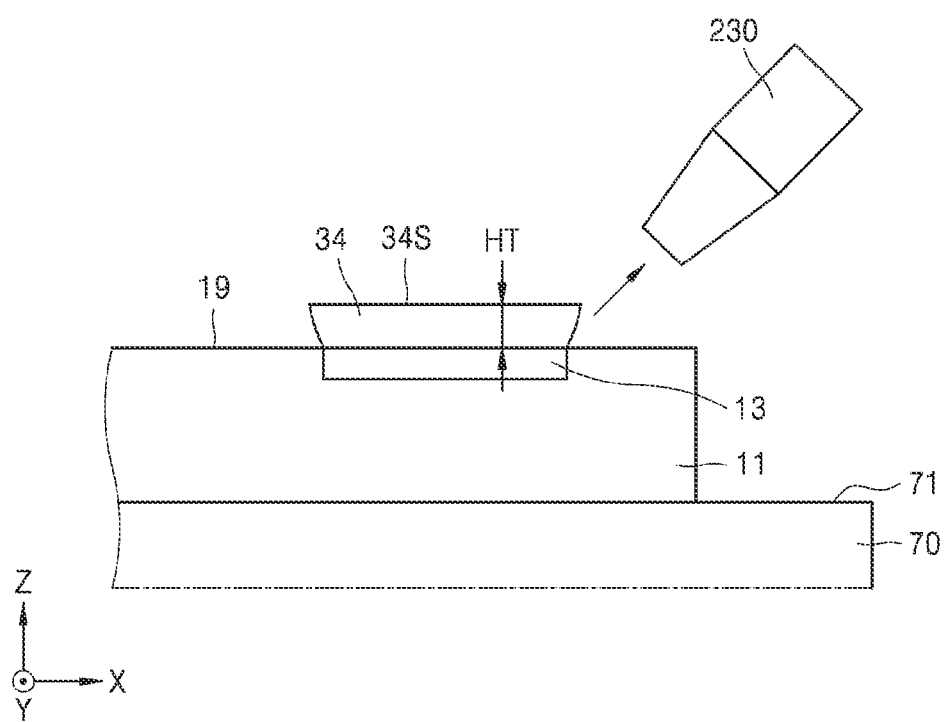

Referring to FIG. 5D, when the first connection bump 33 is conditioned to have the target height HT, residue remaining on substrate 11 and/or the first connection bump 33 may be removed using the suction head 230.

According to embodiments of the inventive concept, because conditioning of the first connection bump 33 is performed automatically by the bump conditioning apparatus 200, rather than manually by a worker, the overall repair process including the bump conditioning process may be accurately realized. In addition, the bump conditioning apparatus 200a may reduce the risk of thermal damage to the substrate 11 and components proximate to the bump conditioning process by using a laser processing method.

Figure 6:
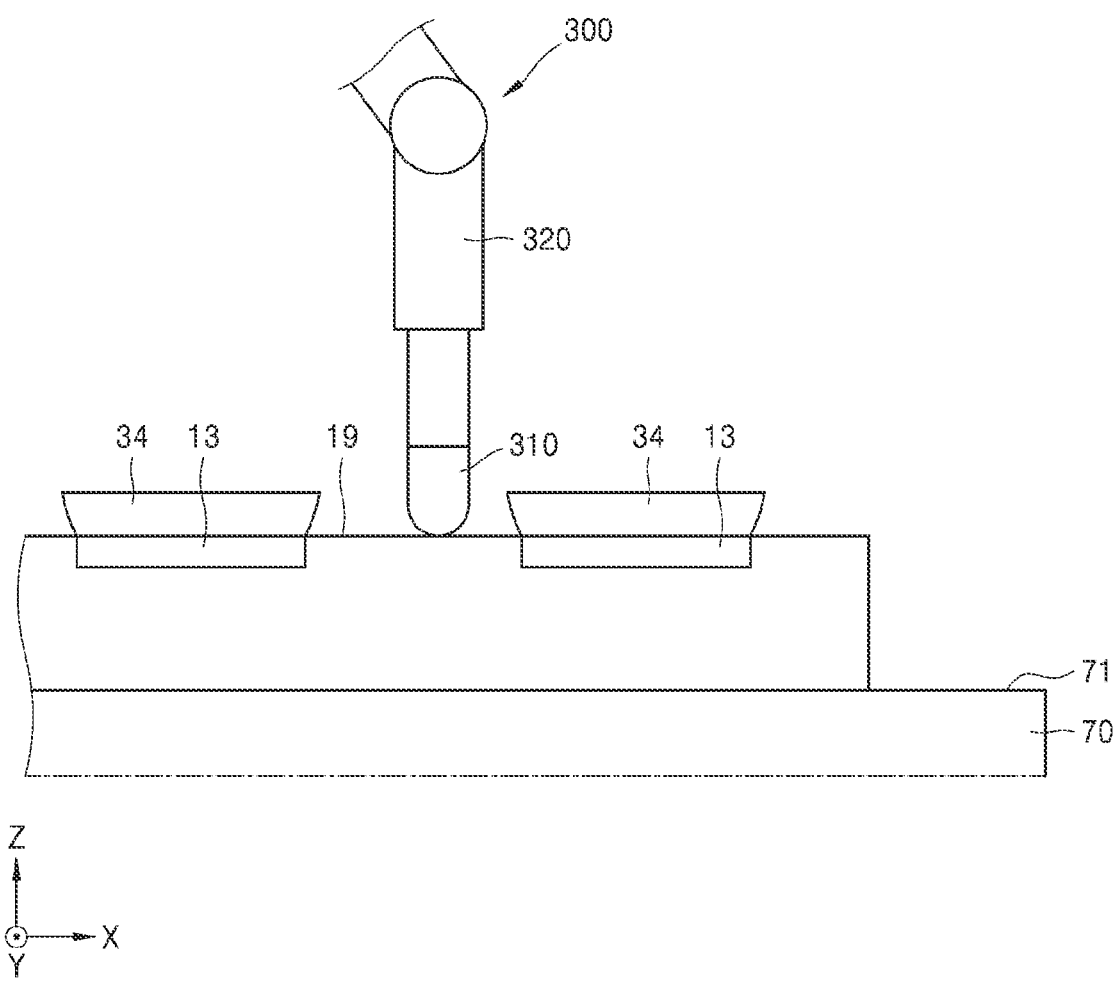
FIG. 6 is a block diagram illustrating a cleaning apparatus of a semiconductor manufacturing apparatus according to embodiments of the inventive concept.

FIG. 6 is a block diagram illustrating a cleaning apparatus 300 of a semiconductor manufacturing apparatus according to embodiments of the inventive concept.

Referring to FIG. 6, the cleaning apparatus 300 may perform a cleaning process that removes residue remaining on the substrate 11 and the conditioned first connection bump 34. For example, when the substrate 11 is transferred to the cleaning apparatus 300 after the bump conditioning process is complete, the cleaning apparatus 300 may remove residue remaining on or the substrate 11 as well as the conditioned first connection bump 34.

The cleaning apparatus 300 may include an articulated robot 320 and a cleaning pad 310 attached to the articulated robot 320. The articulated robot 320 may be, for example, a vertical articulated robot. The articulated robot 320 may perform a cleaning process on the substrate 11 and the first connection bump 33 using the cleaning pad 310 mounted on an end effector. For example, the cleaning pad 310 may include a pad formed of silicon, rubber, or the like, or cleaning means in the form of a brush. The cleaning pad 310 may wipe off residue attached to a surface of the substrate 11 and a surface of the first connection bump 33.

Figure 7B:
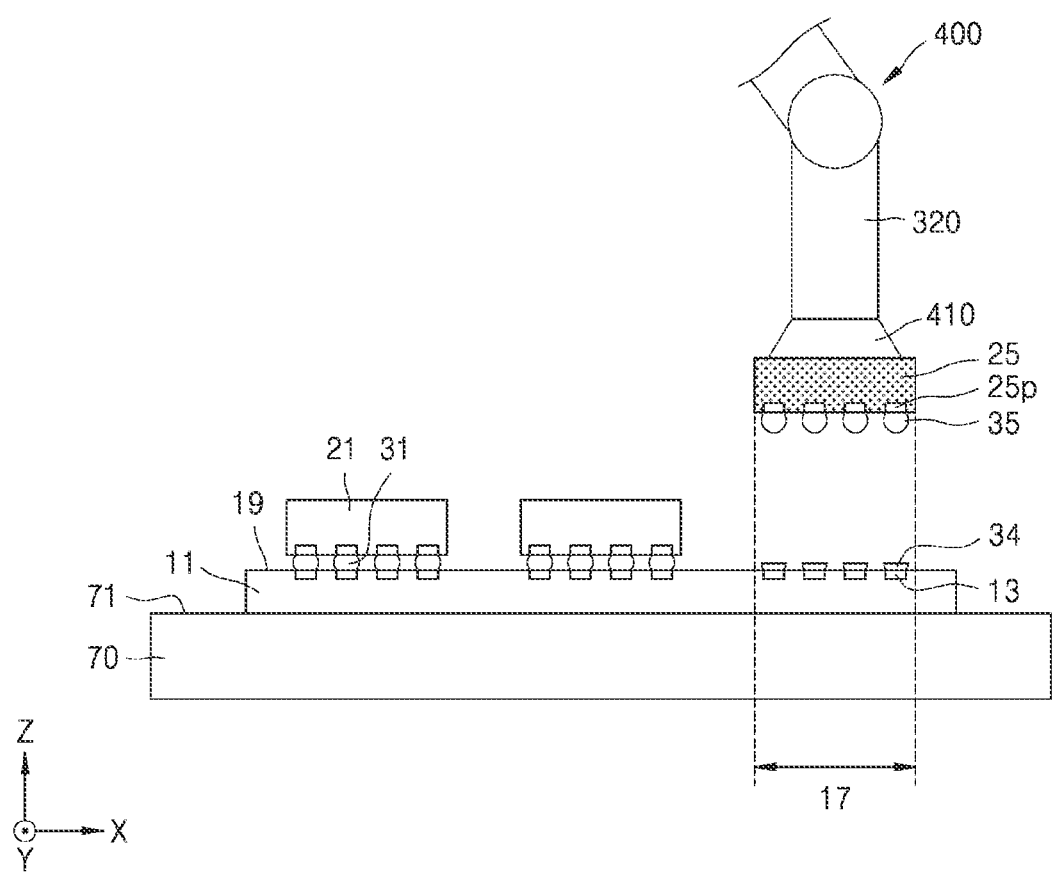
Figure 7C:
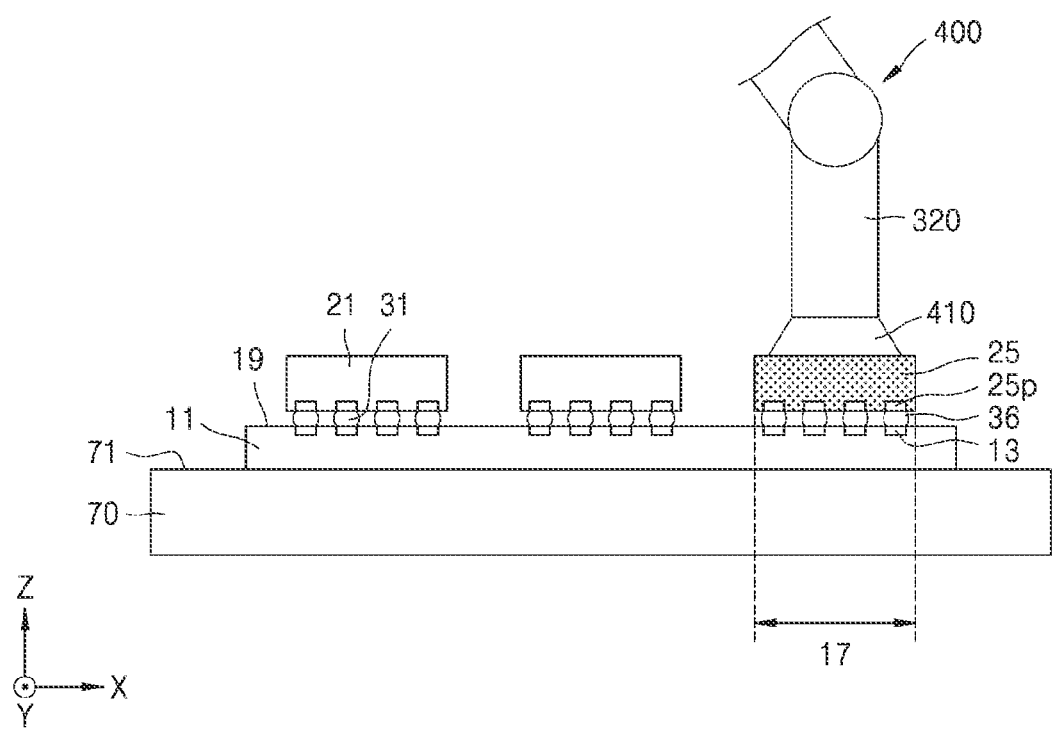

FIGS. 7A to 7C are block diagrams illustrating a component attaching apparatus 400 of a semiconductor manufacturing apparatus according to embodiments of the inventive concept.

Referring to FIGS. 1A, 6 and 7A to 7C, the component attaching apparatus 400 may perform a component attaching process that mounts the non-defective component 25 replacing the separated, defective component 23 in the mounting region 17 of the substrate 11. For example, when the substrate 11, on which the cleaning process has been performed by the cleaning apparatus 300, is transferred to the component attaching apparatus 400, the component attaching apparatus 400 may mount the non-defective component 25, to which the second connection bump 35 is attached, on the mounting region 17. As the second connection bump 35 is coupled to the conditioned first connection bump 34, a third connection bump 36 may be formed. The third connection bump 36 may be between a connection pad 25p of the non-defective component 25 and the connection pad 13 of the substrate 11, and may electrically and mechanically connect the non-defective component 25 to the substrate 11. In this regard, one connection bump may be coupled (e.g., electrically and mechanically joined) to another connection bump using a variety of techniques (e.g., solder reflow, etc.).

The component attaching apparatus 400 may include a transfer head 410 configured to transfer the non-defective component 25. The transfer head 410 may hold the non-defective component 25 and then transfer the non-defective component 25 to be on the mounting region 17 of the substrate 11. For example, the transfer head 410 may be configured to vacuum adsorb the non-defective component 25.

In some embodiments, transfer of the non-defective component 25, performed by the component attaching apparatus 400, may be performed by the articulated robot 320. In this case, the articulated robot 320 may be configured to perform both the cleaning process of the cleaning apparatus 300 and the component attaching process of the component attaching apparatus 400. The articulated robot 320 may be configured to transfer the transfer head 410 mounted on one side thereof.

The component attaching apparatus 400 may include a first imaging apparatus 420 for detecting a position of the substrate 11 and a second imaging apparatus 430 for detecting a position of the non-defective component 25 held by the transfer head 410. For example, the first imaging apparatus 420 and the second imaging apparatus 430 may include image sensors.

The first imaging apparatus 420 may image the upper surface 19 of the substrate 11, and transmit an image signal obtained by imaging the substrate 11 to the controller 80. The controller 80 may detect a position of the mounting region 17 of the substrate 11, to which the non-defective component 25 is to be transferred, based on the image signal obtained from the first imaging apparatus 420. The controller 80 may include an image processor capable of processing the image signal obtained by the first imaging apparatus 420. For example, the controller 80 may detect a relative position of the mounting region 17 of the substrate 11 with respect to a preset reference position. For example, the controller 80 may detect coordinates of the mounting region 17 of the substrate 11 in terms of the first horizontal direction and the second horizontal direction in relation to the preset reference position.

The second imaging apparatus 430 may image the non-defective component 25 attached to a bottom surface of the transfer head 410 before the transfer head 410 moves toward the substrate 11, and may transmit an image signal obtained by imaging the non-defective component 25 to the controller 80. The controller 80 may detect a relative position of the non-defective component 25 with respect to the preset reference position based on the image signal obtained from the second imaging apparatus 430. For example, the controller 80 may detect coordinates of the non-defective component 25 in terms of the first horizontal direction and the second horizontal direction in relation to the preset reference position.

The controller 80 may calculate a moving distance of the transfer head 410 for aligning the non-defective component 25 with the mounting region 17 of the substrate 11, based on information about a relative position of the mounting region 17 of the substrate 11 obtained by processing the image signal transmitted from the first imaging apparatus 420 and a relative position of the non-defective component 25 obtained by processing the image signal transmitted from the second imaging apparatus 430. The controller 80 may apply the control signal including information related to the calculated moving distance of the transfer head 410 to the articulated robot 320. The articulated robot 320 may move the transfer head 410 according to the control signal to align the non-defective component 25 on the mounting region 17 of the substrate 11.

Hereinafter, the component attaching process using the component attaching apparatus 400 will be described with reference to FIGS. 7A to 7C.

Referring to FIG. 7A, the transfer head 410 may vacuum-adsorb the non-defective component 25. The non-defective component 25 may include the second connection bump 35 attached to the bottom surface thereof through a solder dipping process.

Referring to FIGS. 7A and 7B, the first imaging apparatus 420 and the second imaging apparatus 430 may respectively image the mounting region 17 of the substrate 11 and the non-defective component 25 attached to the transfer head 410, and the controller 80 may process image signals transmitted from the first imaging apparatus 420 and the second imaging apparatus 430 to generate a control signal for aligning the non-defective component 25 with the mounting region 17 of the substrate 11. The articulated robot 320 may move the transfer head 410 by driving according to the control signal to align the non-defective component 25 with the mounting region 17 of the substrate 11.

Referring to FIGS. 7B and 7C, the second connection bump 35 of the non-defective component 25 and the conditioned first connection bump 34 may be connected to each other. For example, the second connection bump 35 of the non-defective component 25 and the conditioned first connection bump 34 may be coupled through thermal compression process. The second connection bump 35 and the conditioned first connection bump 34 are coupled to form the third connection bump 36 that electrically and physically connects the non-defective component 25 and the substrate 11 to each other.

Figure 8:
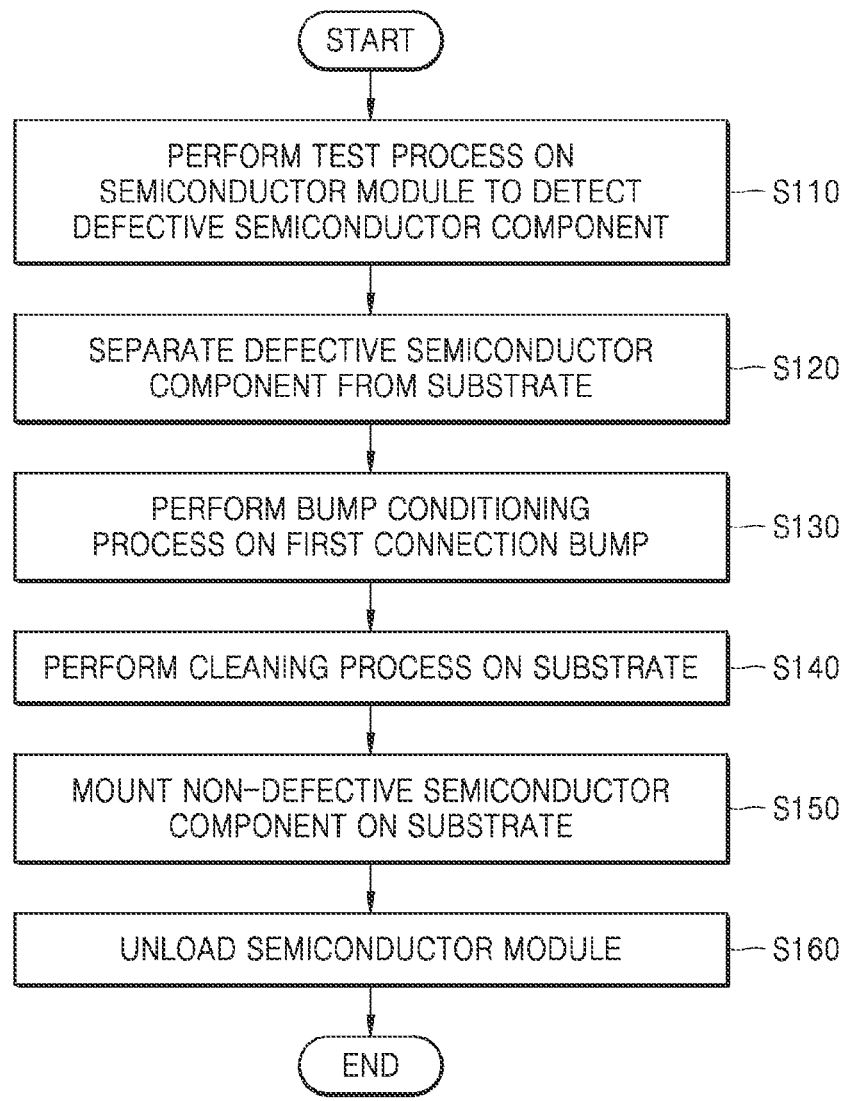
FIG. 8 is a flowchart illustrating a repair process that may be performed by a semiconductor manufacturing apparatus according to embodiments of the inventive concept.

FIG. 8 is a flowchart illustrating a repair process that may be performed by a semiconductor manufacturing apparatus according to embodiments of the inventive concept, and FIG. 9 is a block conceptual diagram illustrating a semiconductor manufacturing apparatus 1000 according to embodiments of the inventive concept.

Hereinafter, a repair process replacing the defective component 23 with the non-defective component 25 using the semiconductor manufacturing apparatus 1000 will be described in relation to FIGS. 8 and 9.

A test process is performed on a semiconductor module to detect the defective component 23 (S110). Through the test process, a defect in the defective component 23 itself or a defect in relation to associated connection bump(s) between the defective component 23 and the substrate 11 may be detected. Once the defective component 23 is detected, the semiconductor module including the defective component 23 may be loaded to a loading stage 1100. In this case, the defective component 23 may include a particular recognition mark (e.g., an inked indicator or symbol, etc.). The loading stage 1100 may transfer the substrate 11 to a component separating stage 1200 connected to one side of the loading stage 1100.

The component separating stage 1200 may perform a component separation process of separating the defective component 23 from the substrate 11 (S120). When the defective component 23 is separated from the substrate 11 through the component separation process, the first connection bumps 33 may be exposed. In some embodiments, after the component separation process is completed, a flux dispensing process of applying a flux to the first connection bumps 33 may be further performed. The component separating stage 1200 may include the component separating apparatus 100 described with reference to FIGS. 1A to 1C or the component separating apparatus 100a described with reference to FIGS. 3A and 3B. When the component separation process is completed in the component separating stage 1200, the substrate 11 is transferred to a bump conditioning stage 1300 connected to one side of the component separating stage 1200.

The bump conditioning stage 1300 may perform a bump conditioning process on the first connection bump 33 exposed by removing the defective component 23 (S130). Through the bump conditioning process, the first connection bumps 33 may be cut to have a target height. The bump conditioning stage 1300 may include the bump conditioning apparatus 200 described with reference to FIGS. 4A to 4D or the bump conditioning apparatus 200a described with reference to FIGS. 5A to 5D. When the bump conditioning process is completed by the bump conditioning stage 1300, the substrate 11 is transferred to a cleaning and component attaching stage 1400 connected to one side of the bump conditioning stage 1300.

The cleaning and component attaching stage 1400 may perform a cleaning process on the substrate 11 (S140). The cleaning and component attaching stage 1400 may include the cleaning apparatus 300 described with reference to FIG. 6.

When the cleaning process is completed, the cleaning and component jig 70 may perform a component attaching process for mounting the non-defective component 25 on the mounting region 17 of the substrate 11 (S150). The cleaning and component attaching stage 1400 may include the component attaching apparatus 400 described with reference to FIGS. 7A to 7C.

In some embodiments, the cleaning and component attaching stage 1400 may perform both the cleaning process on the substrate 11, on which the bump conditioning process is completed, and the component attaching process for mounting the non-defective component 25 on the substrate 11. The cleaning and component attaching stage 1400 may include the cleaning apparatus 300 for performing the cleaning process and the component attaching apparatus 400 for performing the component attaching process. For example, the cleaning and component attaching stage 1400 may include both the cleaning apparatus 300 described with reference to FIG. 6 and the component attaching apparatus 400 described with reference to FIGS. 7A to 7C. In this case, the cleaning apparatus 300 and the component attaching apparatus 400 share the articulated robot 320, and the articulated robot 320 may be used to perform both the cleaning process and the component attaching process. In other embodiments, a cleaning stage configured to perform the cleaning process and a component attaching stage configured to perform the component attaching process may be separately provided.

When the component attaching process is completed by the cleaning and component attaching stage 1400, the substrate 11 is transferred to an unloading stage 1500 connected to one side of the cleaning and component attaching stage 1400. The unloading stage 1500 unloads the semiconductor module on which the repair process is completed (S160). In some embodiments, before the semiconductor module is unloaded, a reflow process for strengthening a connection between the non-defective component 25 and the substrate 11 may be performed.

According to embodiments of the inventive concept, because thermal damage to the substrate 11 and components may be minimized during the repair process, the reliability of the semiconductor module on which the repair process is completed may be improved.

While the inventive concept has been particularly shown and described with reference to the foregoing illustrated embodiments, it will be understood by those skilled in the art that various changes in form and details may be made therein without departing from the scope of the following claims, as defined by the following claims.

What is claimed is:

1. A semiconductor manufacturing apparatus comprising:
a component separating apparatus configured to separate a defective component from a substrate;
a bump conditioning apparatus including an end mill cutter and receiving the substrate following separation of the defective component from the substrate, the bump conditioning apparatus being configured to cut a first connection bump using the end mill cutter to provide a conditioned first connection bump, and the first connection bump being exposed by separating the defective component from the substrate; and
a component attaching apparatus configured to receive the substrate following provision of the conditioned first connection bump and mount a new component including a second connection bump to the substrate by coupling the second connection bump and the conditioned first connection bump.

2. The semiconductor manufacturing apparatus of claim 1, wherein the component separating apparatus comprises:
a frame;
an aperture including an opening, wherein the aperture is disposed in the frame;
a laser light source configured to generate a laser beam and irradiate the defective component with the laser beam through the frame and the opening of the aperture; and
a suction pump configured to apply a suction force to the defective component through the frame and the opening of the aperture, thereby separating the defective component from the substrate.

3. The semiconductor manufacturing apparatus of claim 2, wherein the aperture is configured to adjust a first width of the opening and a first length of the opening while the laser light source irradiates the defective component with the laser beam, such that the first width is greater than or equal to a second width of the defective component and the first length is greater than or equal to a second length of the defective component.

4. The semiconductor manufacturing apparatus of claim 2, wherein the frame comprises:
a first opening through which the laser beam irradiates the defective component;
a first passage extending from the first opening to the opening of the aperture;
a second opening connected to the suction pump;
a second passage extending between the second opening and the first passage; and
a gate configured to pivot between a first position separating the first passage from the second passage and a second position closing the first opening.

5. The semiconductor manufacturing apparatus of claim 1, wherein the component separating apparatus further comprises a heating block configured to heat the defective component using thermal conduction to melt the first connection bump.

6. The semiconductor manufacturing apparatus of claim 1, wherein the bump conditioning apparatus is configured to perform a first cutting at a first height above an upper surface of the substrate using the end mill cutter on the first connection bump in a lateral direction parallel to the upper surface of the substrate and then perform a second cutting at a second height lower than the first height using the end mill cutter on the first connection bump.

7. The semiconductor manufacturing apparatus of claim 6, wherein the bump conditioning apparatus further includes a height sensor configured to detect a height in relation to the upper surface of the substrate and is further configured to adjust a vertical position of the end mill cutter according to the height detected by the height sensor.

8. The semiconductor manufacturing apparatus of claim 1, wherein:
the bump conditioning apparatus is further configured to cut the first connection bump such that the first connection bump has a cut surface parallel to an upper surface of the substrate, and
a distance between the upper surface of the substrate and the cut surface of the first connection bump ranges between about 60 μm and about 120 μm.

9. The semiconductor manufacturing apparatus of claim 1, wherein the bump conditioning apparatus further includes a suction head configured to remove residue produced by cutting the first connection bump.

10. The semiconductor manufacturing apparatus of claim 1, further comprising a cleaning apparatus configured to receive the substrate following provision of the conditioned first connection bump and clean residue from the substrate using a cleaning pad mounted on an articulated robot.

11. The semiconductor manufacturing apparatus of claim 1, wherein the component attaching apparatus comprises:
a transfer head configured to hold and transfer the new component;
a first imaging apparatus configured to image a mounting region of the substrate; and
a second imaging apparatus configured to image the new component held by the transfer head.

12. The semiconductor manufacturing apparatus of claim 11, further comprising an articulated robot configured to move the transfer head.

13. A semiconductor manufacturing apparatus comprising:
a component separating apparatus configured to separate a defective component from a substrate and including:
a frame;
an aperture including an opening, wherein the aperture is disposed in a bottom surface of the frame;
a laser light source configured to generate a laser beam and irradiate the defective component with the laser beam through the frame and the opening of the aperture; and
a suction pump configured to apply a suction force to the defective component through the frame and the opening of the aperture to separate the defective component from the substrate, wherein:
the frame comprises:
a first opening through which the laser beam irradiates the defective component,
a first passage extending from the first opening to the opening of the aperture,
a second opening connected to the suction pump,
a second passage extending between the second opening and the first passage, and
a gate configured to pivot between a first position separating the first passage from the second passage and a second position closing the first opening;
a bump conditioning apparatus configured to receive the substrate following separation of the defective component from the substrate and cut a first connection bump to a target height to provide a conditioned first connection bump, wherein the first connection bump is exposed by separating the defective component from the substrate; and
a component attaching apparatus configured to receive the substrate following provision of the conditioned first connection bump and mount a new component including a second connection bump to the substrate by coupling the second connection bump and the conditioned first connection bump.

14. The semiconductor manufacturing apparatus of claim 13, wherein the bump conditioning apparatus comprises a laser supply head configured to irradiate the first connection bump with a laser beam to remove part of the first connection bump.

15. The semiconductor manufacturing apparatus of claim 14, wherein the laser supply head is further configured to generate a pico-second pulsed laser.

16. The semiconductor manufacturing apparatus of claim 13, wherein the bump conditioning apparatus further comprises:
a spindle; and
an end mill cutter mounted on the spindle and configured to cut the first connection bump by moving laterally in parallel with an upper surface of the substrate.

17. The semiconductor manufacturing apparatus of claim 13, wherein the aperture is configured to adjust a first width of the opening and a first length of the opening in relation to a second width of the defective component and to a second length of the defective component.

18. A semiconductor manufacturing apparatus comprising:
a loading stage configured to load a semiconductor module, wherein the semiconductor module includes a substrate and a defective component mounted on a mounting region of the substrate through a first connection bump;
a component separating stage configured to receive the semiconductor module from the loading stage and separate the defective component from the substrate, wherein the first connection bump is exposed by separating the defective component from the substrate;
a bump conditioning stage configured to receive the semiconductor module from the component separating stage and remove part of the first connection bump to provide a conditioned first connection bump having a target height; and
a component attaching stage configured to receive the semiconductor module following provision of the conditioned first connection bump and mount a new component including a second connection bump to the substrate by coupling the second connection bump and the conditioned first connection bump, wherein
the component separating stage comprises:
a frame;
an aperture including an opening, wherein the aperture is disposed in a bottom surface of the frame;
a laser light source configured to generate a laser beam and irradiate the defective component with the laser beam through the frame and the opening of the aperture; and
a suction pump configured to apply a suction force to the defective component through the frame and the opening of the aperture to separate the defective component from the substrate, and
the bump conditioning stage comprises:
a spindle;
an end mill cutter mounted on the spindle and configured to cut the first connection bump while laterally moving parallel to an upper surface of the substrate; and
a height sensor configured to detect a height in relation to the upper surface of the substrate.

19. The semiconductor manufacturing apparatus of claim 18, further comprising:
an articulated robot;
a cleaning pad mounted on the articulated robot and configured to clean residue from the substrate following provision of the conditioned first connection bump; and
a transfer head mounted on the articulated robot and configured to hold the new component.

* * * * *